United States Patent
Kuwajima et al.

(10) Patent No.: US 10,886,213 B2
(45) Date of Patent: Jan. 5, 2021

(54) SEMICONDUCTOR DEVICE

(71) Applicant: RENESAS ELECTRONICS CORPORATION, Tokyo (JP)

(72) Inventors: Teruhiro Kuwajima, Ibaraki (JP); Yasutaka Nakashiba, Ibaraki (JP); Akira Matsumoto, Ibaraki (JP); Akio Ono, Ibaraki (JP); Tetsuya Iida, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/984,710

(22) Filed: Aug. 4, 2020

(65) Prior Publication Data

US 2020/0365508 A1    Nov. 19, 2020

Related U.S. Application Data

(63) Continuation of application No. 16/192,521, filed on Nov. 15, 2018.

(30) Foreign Application Priority Data

Dec. 28, 2017 (JP) .................... 2017-253931

(51) Int. Cl.
*H03L 7/06* (2006.01)
*H01L 23/522* (2006.01)
(Continued)

(52) U.S. Cl.
CPC ...... *H01L 23/5223* (2013.01); *H01L 23/5222* (2013.01); *H01L 23/5227* (2013.01);
(Continued)

(58) Field of Classification Search
CPC ............. H01L 23/5222; H01L 23/5223; H01L 23/5227; H01L 27/0617; H01L 27/0629;
(Continued)

(56) References Cited

U.S. PATENT DOCUMENTS 6,358,820 B1    3/2002  Maeda
8,378,470 B2*   2/2013  Nakashiba .............. H01L 23/48
                                                      257/676
(Continued)

FOREIGN PATENT DOCUMENTS

JP      2002-009299 A    1/2002

OTHER PUBLICATIONS

U.S. PTO Non-Final Office Action issed in related parent U.S. Appl. No. 16/192,521, dated Jan. 13, 2020.
(Continued)

*Primary Examiner* — Yuriy Semenenko
(74) *Attorney, Agent, or Firm* — McDermott Will & Emery LLP

(57) ABSTRACT

A semiconductor device has a coil and wirings under the coil. In addition, a distance between the upper face of the wirings and the bottom face of the coil is 7 μm or larger, and the wirings have a plurality of linear wiring parts each wiring width of which is 1 μm or smaller. In addition, the linear wiring parts do not configure a loop wiring, and the coil and the linear wiring parts are overlapped with each other in planar view.

16 Claims, 34 Drawing Sheets

(51) Int. Cl.
    *H01L 49/02*     (2006.01)
    *H03L 7/099*     (2006.01)
    *H01L 29/93*     (2006.01)
    *H01L 27/06*     (2006.01)

(52) U.S. Cl.
    CPC .......... *H01L 27/0629* (2013.01); *H01L 28/10* (2013.01); *H01L 28/86* (2013.01); *H01L 29/93* (2013.01); *H03L 7/099* (2013.01)

(58) Field of Classification Search
    CPC ......... H01L 28/10; H01L 28/86; H01L 29/93; H03L 7/099
    See application file for complete search history.

(56) References Cited

U.S. PATENT DOCUMENTS

| | | | | |
|---|---|---|---|---|
| 9,984,965 | B2* | 5/2018 | Tsai | ...................... H01L 23/585 |
| 10,128,125 | B2* | 11/2018 | Funaya | .................. H01L 24/03 |
| 2006/0038621 | A1 | 2/2006 | Shiramizu et al. | |
| 2009/0146252 | A1* | 6/2009 | Huang | ................... H01L 28/10 |
| | | | | 257/531 |
| 2009/0152674 | A1* | 6/2009 | Uchida | ............... H01L 29/0619 |
| | | | | 257/531 |
| 2009/0302420 | A1 | 12/2009 | Nakashiba | |
| 2010/0246152 | A1* | 9/2010 | Lin | ......................... H01L 24/92 |
| | | | | 361/783 |
| 2011/0298551 | A1* | 12/2011 | Yen | ....................... H01L 27/016 |
| | | | | 331/117 FE |
| 2013/0075859 | A1* | 3/2013 | Kerber | ................ H01L 23/5227 |
| | | | | 257/531 |
| 2013/0075861 | A1* | 3/2013 | Kerber | ................. H01L 29/402 |
| | | | | 257/531 |
| 2013/0207269 | A1 | 8/2013 | Oshida | |
| 2014/0264722 | A1* | 9/2014 | Nakashiba | .......... H01L 23/5227 |
| | | | | 257/506 |
| 2015/0318245 | A1 | 11/2015 | Uchida et al. | |
| 2015/0326235 | A1 | 11/2015 | Pavao-Moreira et al. | |
| 2015/0380480 | A1 | 12/2015 | Ozawa et al. | |
| 2019/0206789 | A1* | 7/2019 | Kuwajima | .......... H01L 23/5227 |

OTHER PUBLICATIONS

U.S. PTO Final Office Action issed in related parent U.S. Appl. No. 16/192,521, dated May 8, 2020.
Related parent U.S. Appl. No. 16/192,521, filed Nov. 15, 2018.

\* cited by examiner

SEMICONDUCTOR DEVICE

CROSS-REFERENCE TO RELATED APPLICATIONS

This is a Continuation of U.S. patent application Ser. No. 16/192,521 filed on Nov. 15, 2018, which claims the benefit of Japanese Patent Application No. 2017-253931 filed on Dec. 28, 2017 including the specification, drawings and abstract are incorporated herein by reference in their entirety.

BACKGROUND

The present invention relates to a semiconductor device, and relates to an effective technique by being applied to, for example, a semiconductor device having a coil.

The Internet has been mainly connected to IT-related devices such as a personal computer, a server, and a printer. However, IoT (Internet of Things) through which the Internet is connected to home electric appliances and the like other than IT-related devices has been rapidly advanced.

With such wide spread of IoT, improvement in performance of RF (Radio Frequency) devices for wireless communications has been desired.

For example, Japanese Unexamined Patent Application Publication No. 2002-9299 discloses a semiconductor device in which a complete separation is provided between a PMOS and an NMOS, and another complete separation is further provided under a spiral inductor provided in a region different from the PMOS and the NMOS.

SUMMARY

The inventors have been engaged in research and development of a Phase Locked Loop (PLL) circuit and an LC-Voltage Controller Oscillator (LC-VCO) circuit in the PLL circuit as an RF (Radio Frequency) device that is a semiconductor device having a coil (spiral inductor), and have conducted an extensive study on improvement in characteristics thereof.

In the case where an element is arranged directly under a coil (spiral inductor), a Q-factor is decreased, and the characteristics of a PLL circuit and an LC-VCO circuit are deteriorated. Further, as described in Japanese Unexamined Patent Application Publication No. 2002-9299, in the case where a formation region for a spiral inductor and an element formation region are provided separately from each other, the formation areas of the PLL circuit and the LC-VCO circuit are increased.

Therefore, a study on a technique by which an RF device can be downsized while keeping the characteristics of the RF device is desired.

The other problems and novel features will become apparent from the description of the specification and the accompanying drawings.

The following is a summary of the representative outline of embodiments disclosed in the application.

A semiconductor device shown in an embodiment disclosed in the application has a coil and wirings under the coil. In addition, a distance between the upper face of the wirings and the bottom face of the coil is 7 μm or larger, and a first wiring has a plurality of linear wiring parts each wiring width of which is 1 μm or smaller. In addition, the linear wiring parts do not configure a loop wiring, and the coil and the linear wiring parts are overlapped with each other in planar view.

According to the semiconductor device shown in the representative embodiments below disclosed in the application, the characteristics of the semiconductor device can be improved.

DETAILED DESCRIPTION

Figure 1:
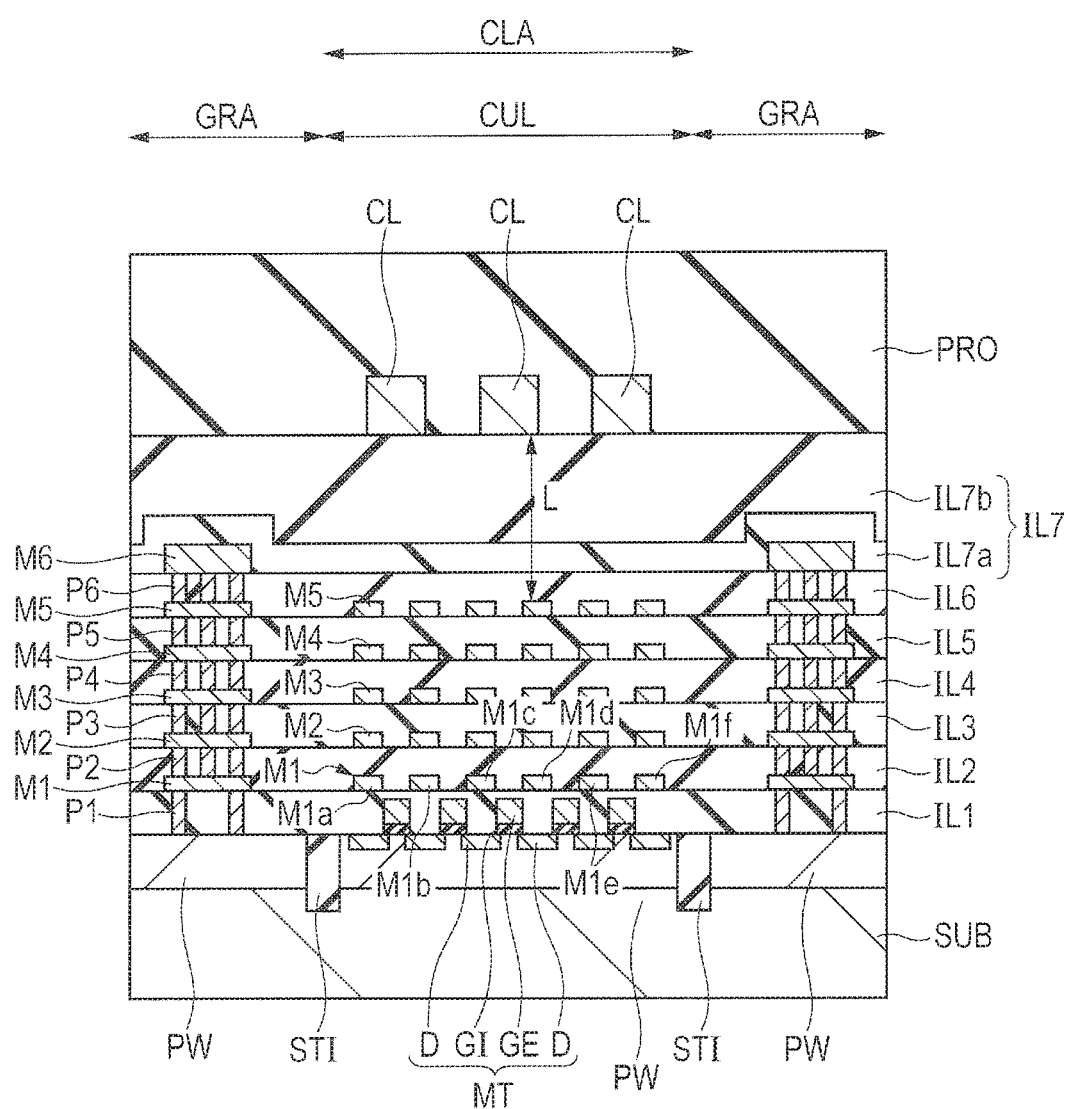
FIG. 1 is a cross-sectional view for schematically showing a configuration of a semiconductor device of a first embodiment.

The present invention will be described using the following embodiments while being divided into a plurality of sections or embodiments if necessary for convenience sake. However, except for a case especially specified, the sections or embodiments are not irrelevant to each other, and one has a relationship as a part or all of a modified example, an application, a detailed explanation, or a supplementary explanation of the other. Further, when the specification refers to the number of elements (including the number of pieces, values, amounts, ranges, and the like) in the following embodiments, the number is not limited to the specific number, but may be smaller or larger than the specific number, except for a case especially specified or a case obviously limited to the specific number in principle.

Furthermore, the constitutional elements (including operational steps and the like) are not necessarily essential in the following embodiments except for a case especially specified or a case obviously deemed to be essential in principle. Likewise, when the specification refers to the shapes or positional relationships of the constitutional elements in the following embodiments, the present invention includes the constitutional elements that are substantially close or similar in shapes and the like, except for a case especially specified or a case obviously deemed not to be close or similar in principle. The same applies to the number (including the number of pieces, values, amounts, ranges, and the like).

Hereinafter, the embodiments of the present invention will be described in detail on the basis of the drawings. It should be noted that members having the same functions are followed by the same or relevant signs in all the drawings for explaining the embodiments, and the repeated explanation thereof will be omitted. Further, in the case where a plurality of similar members (parts) exits, symbols are added to general signs to show individual or specific parts in some cases. Further, the explanation of the same or similar portions will not be repeated in principle in the following embodiments except for a case where the explanation is necessary.

Further, hatchings will be omitted in some cases even in the case of a cross-sectional view in order to easily view the drawing used in the embodiment. Further, hatchings will be added in some cases even in the case of a plan view in order to easily view the drawing.

Further, the size of each part is not associated with an actual device in a cross-sectional view and a plan view, and a specific part is relatively enlarged in some cases in order to easily understand the drawings. Further, even in the case where a plan view is associated with a cross-sectional view, the size of each part is changed and shown in some cases.

First Embodiment

[Description of Structure]

FIG. 1 is a cross-sectional view for schematically showing a configuration of a semiconductor device of the embodiment. In the semiconductor device shown in FIG. 1, wirings M1 (SL) having the following shield function are arranged under a coil (spiral inductor) CL.

The wirings M1 (SL) are configured using a plurality of linear wiring parts M1$a$ to M1$f$. The wiring width of each linear wiring part is 1 µm or smaller, and the linear wiring parts do not configure loop wirings (a first condition and a shape condition). The loop wirings are circular wirings. For example, the loop wirings are circular wirings formed by coupling the linear wiring parts M1$a$ to M1$f$ and other wirings (for example, a guard ring GR and the like) (see FIG. 7A).

In addition, the linear wiring parts M1$a$ to M1$f$ are located in a wiring layer apart from the bottom face of the coil CL by 7 µm or larger. Namely, the distance between the wirings M1$a$ to M1$f$ and the coil CL is 7 µm or larger (a second condition and a depth condition).

In addition, the linear wiring parts M1$a$ to M1$f$ are wirings of a layer lower than wirings (wirings M6 in FIG. 1) of a layer lower than the coil CL. In other words, the linear wiring parts M1$a$ to M1$f$ are wirings located lower than the coil (re-wiring layer) CL by two layers or more (the second condition and the depth condition). It should be noted that the distance (L) between wirings M5 and the coil CL is about 7 µm in FIG. 1.

Even if such wirings M1 (linear wiring parts M1$a$ to M1$f$) are arranged under the coil CL, the characteristics (for example, RF characteristics) of the semiconductor device are not deteriorated. In addition, the area of the semiconductor device can be reduced or high integration of elements can be realized by laminating elements (for example, MOM capacitance elements and the like) having the coil CL and the linear wiring parts.

It should be noted that the linear wiring parts M1$a$ to M1$f$ are formed using a first wiring layer (an M1 layer) in the embodiment. However, the linear wiring parts M1$a$ to M1$f$ may be formed using other wiring layers (an M2 layer, an M3 layer, an M4 layer, and an M5 layer) as long as the above-described depth conditions are satisfied.

In addition, the wirings under the coil CL are referred to as CUL (Circuit under L) in some cases. It should be noted that a region CLA is a coil (spiral inductor) formation region, and a region GRA is a guard ring formation region. The guard ring GR is configured using the wirings M1 to M6, and the wirings are coupled to each other through plugs P1 to P6 (see FIG. 1). The guard ring GR is arranged so as to largely surround the region CLA. The distance between the guard ring GR and the outermost periphery of the coil (spiral inductor) CL is about, for example, 30 μm.

It should be noted that the above-described plugs P1 to P6 are provided in interlayer insulation films IL1 to IL6, respectively. In addition, SUB denotes a semiconductor substrate, and PW denotes a p-type well.

Examples by which the above-described conditions were found will be described below.

EXAMPLES

First Example

Figure 2A:
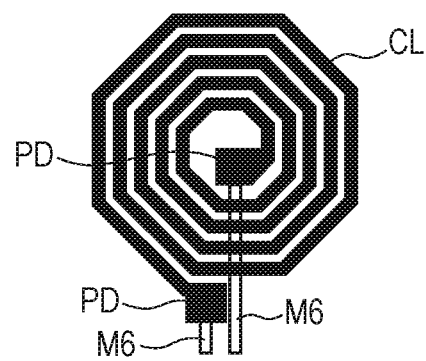
FIGS. 2A to 2C are plan views each showing a lamination state of a coil and wirings (CUL) thereunder.
Figure 2B:
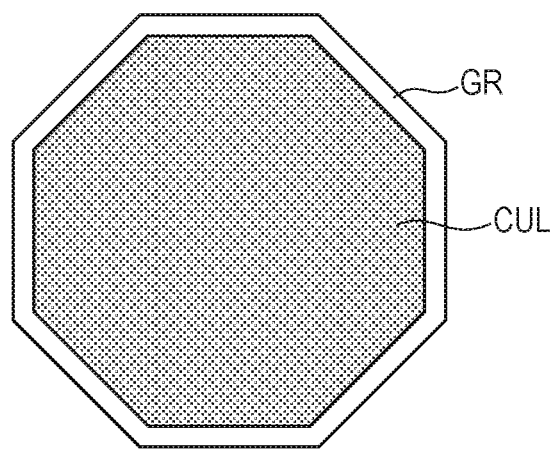
Figure 2C:
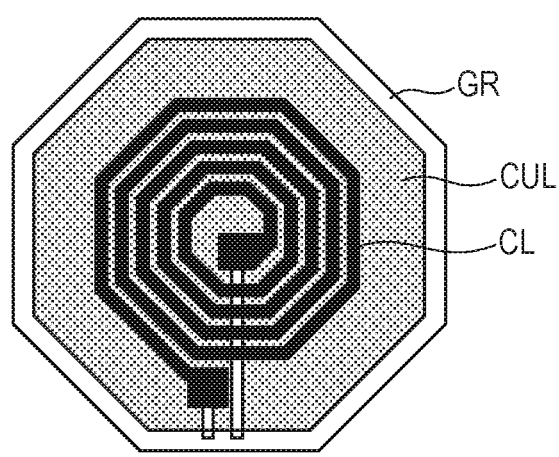
Figure 3:
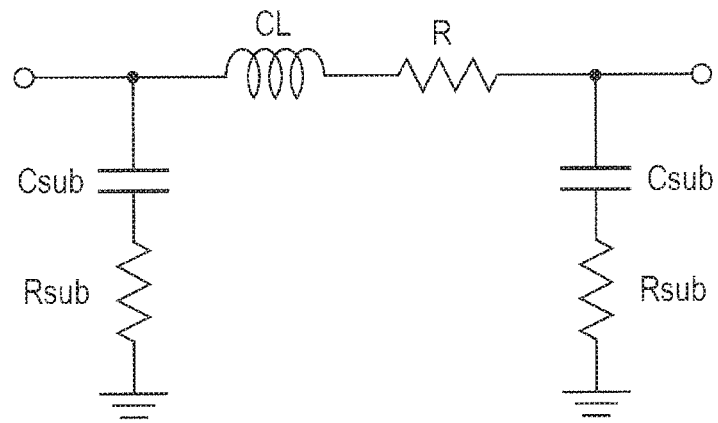
FIG. 3 is an equivalent circuit diagram of FIGS. 2A to 2C.

FIGS. 2A to 2C are plan views each showing a lamination state of the coil (spiral inductor) CL and the wirings (CUL) thereunder, and FIG. 3 is an equivalent circuit diagram of FIGS. 2A to 2C.

The coil (spiral inductor) CL shown in FIG. 2A is provided in a re-wiring layer, and is configured using a spiral wiring. Here, single winding of the coil CL is formed in an octagon shape. Pad parts PD are provided at both ends of the coil CL. Plugs are provided under the pad parts PD, and the pad parts PD are coupled to wirings (for example, sixth wirings M6) just below the pad parts PD through the plugs.

Wirings (for example, fifth wirings M5) as CUL are provided under the coil (spiral inductor) CL (FIG. 2B). The wirings CUL (for example, the fifth wirings M5) are coupled to the guard ring GR. As described above, the guard ring GR is configured using the wirings M1 to M6, and the wirings are coupled to each other through the plugs P1 to P6 (see FIG. 1).

As shown in FIG. 2C, the coil (spiral inductor) CL and the wirings (for example, the fifth wirings M5) that are CUL are arranged while being overlapped with each other in planar view.

As shown in FIG. 3, a substrate resistor Rsub and a substrate capacitance Csub are coupled in series between one end of the coil CL and a ground potential. In addition, a substrate resistor Rsub and a substrate capacitance Csub are coupled in series between the other end of the coil CL and a ground potential. R denotes the coil CL.

Figure 4:
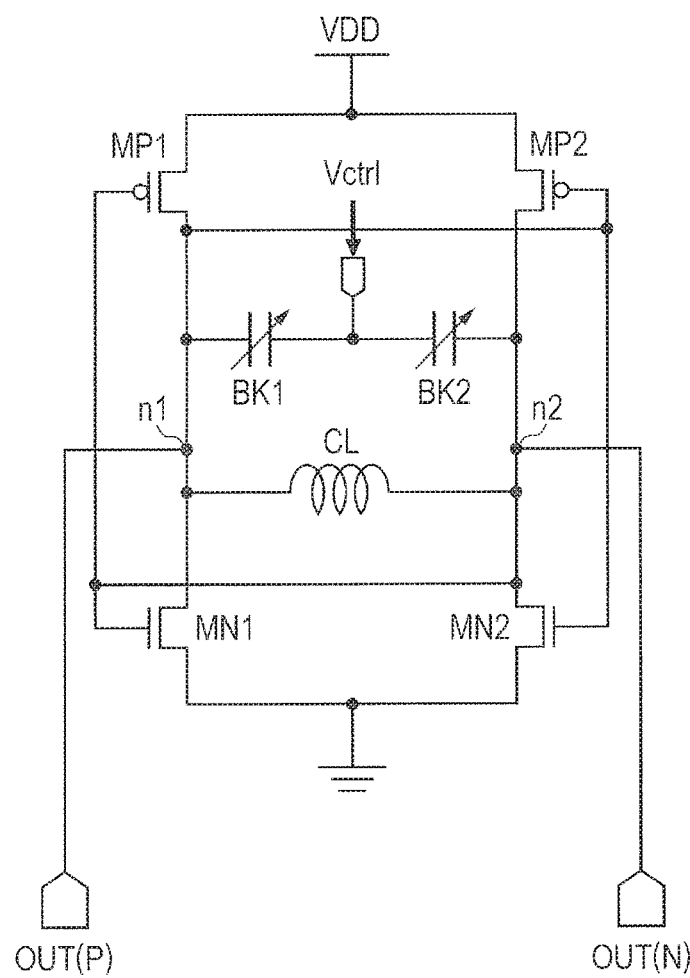
FIG. 4 is a circuit diagram for showing an LC-VCO circuit.
Figure 5:
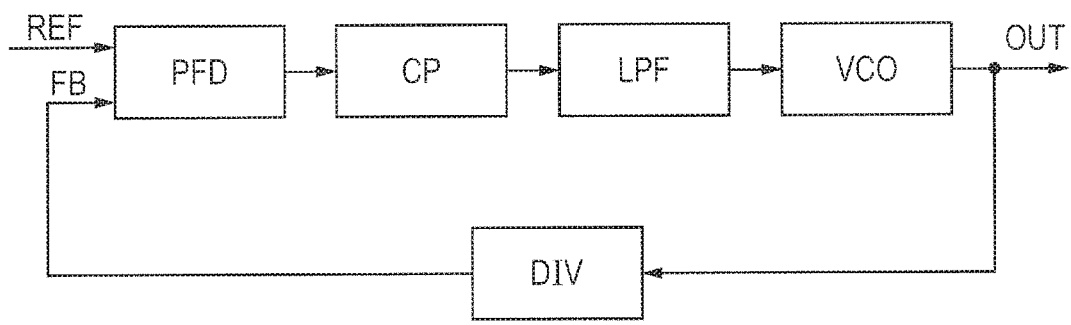
FIG. 5 is a block diagram for showing a PLL circuit.

The coil (spiral inductor) CL as described above is used for an LC-VCO circuit. In addition, the LC-VCO circuit is used for a PLL circuit. FIG. 4 is a circuit diagram for showing an LC-VCO circuit. FIG. 5 is a block diagram for showing a PLL circuit.

VCO circuits (Voltage-controlled oscillators) are oscillation circuits (oscillators) that control an oscillation frequency using a voltage. Among those, the LC-VCO circuit is a VCO circuit having an inductor and a capacitance.

Specifically, as shown in FIG. 4, the LC-VCO circuit has a p-type MOS transistor MP1 and an n-type MOS transistor MN1 that are coupled in series between a power supply potential VDD and a ground potential (GND). A coupling part (node n1) for these serves as an output part OUT (P). In addition, the LC-VCO circuit has a p-type MOS transistor MP2 and an n-type MOS transistor MN2 that are coupled in series between the power supply potential VDD and the ground potential (GND). A coupling part (node n2) for these serves as an output part OUT (N).

The gate electrodes of the p-type MOS transistor MP1 and the n-type MOS transistor MN1 are coupled to the node n2 (OUT (N)), and the gate electrodes of the p-type MOS transistor MP2 and the n-type MOS transistor MN2 are coupled to the node n1 (OUT (P)).

In addition, the coil (spiral inductor) CL is coupled between the node n1 (OUT (P)) and the node n2 (OUT (N)).

In addition, varactors (variable capacitance elements) BK1 and BK2 are coupled between the node n1 (OUT (P)) and the node n2 (OUT (N)). The two varactors BK1 and BK2 are coupled to a terminal to which a control potential Vctrl is applied, and the capacitances thereof are changed by the control potential Vctrl.

The LC-VCO circuit shown in FIG. 4 is incorporated into a PLL circuit. The PLL (Phase Locked Loop) circuit is a circuit that generates a clock signal synchronized with a reference clock signal. As shown in FIG. 5, the PLL circuit has a phase frequency detector PFD, a charge pump CP coupled to the phase frequency detector PFD, a loop filter LPF coupled to the charge pump CP, an LC-VCO circuit (Voltage Controlled Oscillator) VCO coupled to the loop filter LPF, and a divider DIV. The divider DIV is coupled to the LC-VCO circuit VCO and the phase frequency detector PFD.

The phase frequency detector PFD compares a phase difference or a frequency difference between an input signal REF and a feedback signal FB from the divider DIV, and outputs the comparison result as a pulse. The charge pump CP converts the pulse (digital signal) that is an output signal of the phase frequency detector PFD into a current (analog signal), and outputs the current. The loop filter LPF converts the current (analog signal) from the charge pump CP into a voltage, and outputs the voltage. The output of the loop filter LPF serves as an input control voltage for the LC-VCO circuit VCO, and the LC-VCO circuit VCO outputs a signal obtained by changing the oscillation frequency using the input control voltage. The divider DIV outputs a signal (feedback signal) obtained by changing the output of the LC-VCO circuit VCO into 1/N. The feedback signal FB is input to the phase frequency detector PFD.

Figure 6:
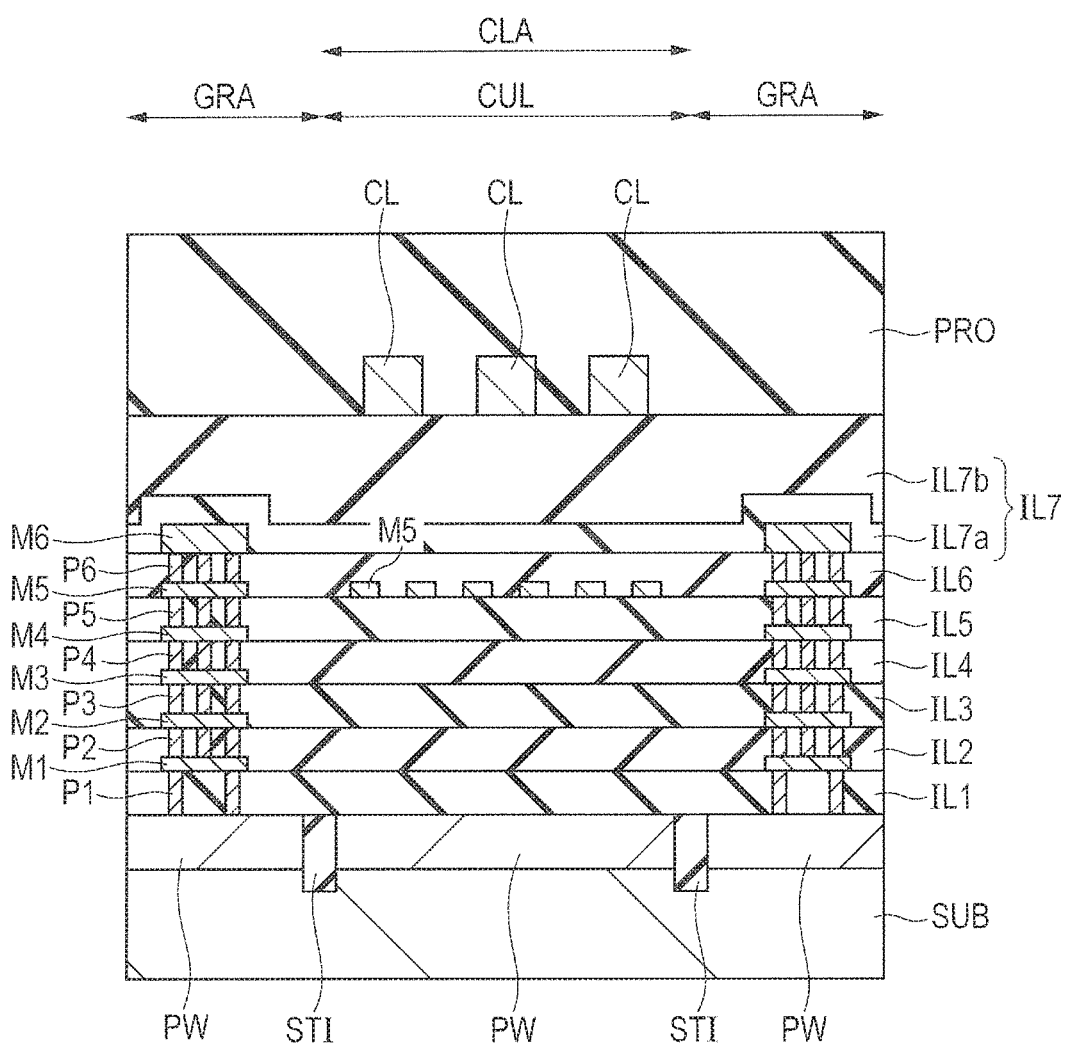
FIG. 6 is a cross-sectional view for schematically showing a relation between the coil and wirings M5.
Figure 7A:
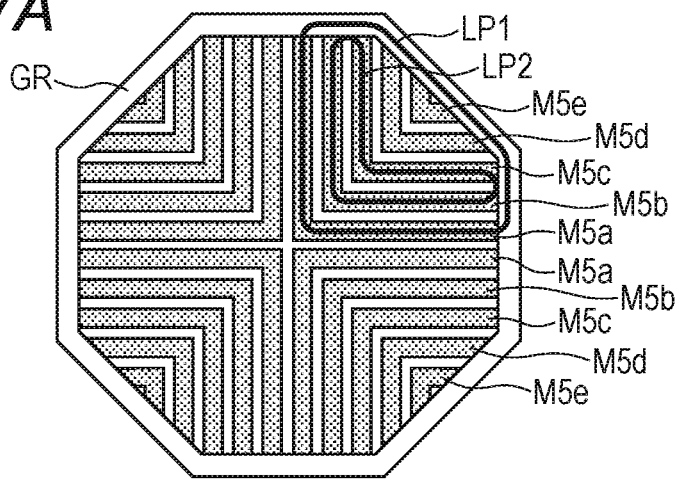
FIGS. 7A to 7C are plan views each showing a layout of the wirings M5.
Figure 7B:
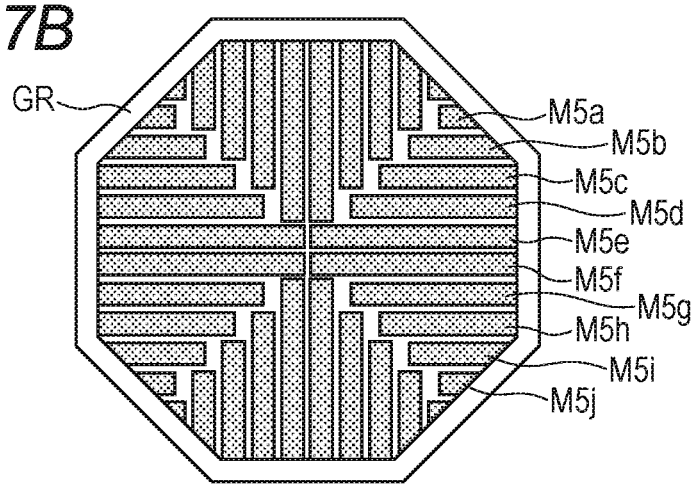
Figure 7C:
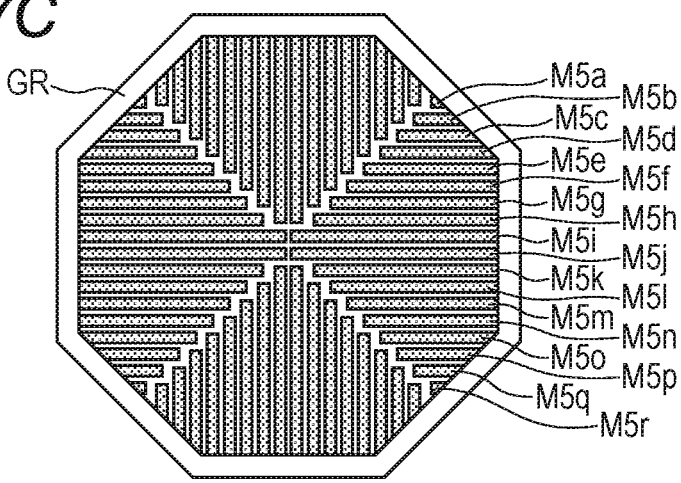

In the first example, as shown in FIG. 2, the wirings M5 (CUL) are arranged under the coil (spiral inductor) CL. FIG. 6 is a cross-sectional view for schematically showing a relation between the coil (spiral inductor) CL and the wirings M5. FIG. 7A to FIG. 7C are plan views each showing a layout of the wirings M5.

As the wirings M5 under the coil (spiral inductor) CL shown in FIGS. 2A to 2C and FIG. 6, a case in which L-shape wirings M5a to M5e as shown in FIG. 7A were arranged inside the guard ring GR, a case in which linear wiring parts M5a to M5j as shown in FIG. 7B were arranged, and a case in which thin linear wiring parts M5a to M5r as shown in FIG. 7C were arranged were studied. The wiring width in FIG. 7A and FIG. 7B is 4 μm. In addition, the wiring width in FIG. 7C is 1 μm. The wirings M5 are located at a position apart from the bottom face of the coil CL by about 7 μm (see FIG. 6). In addition, the wirings M5 are wirings located lower than the re-wiring layer by two layers or more. The width of the coil CL is 10 μm, and an interval of the coil CL is 8 μm.

Figure 8:
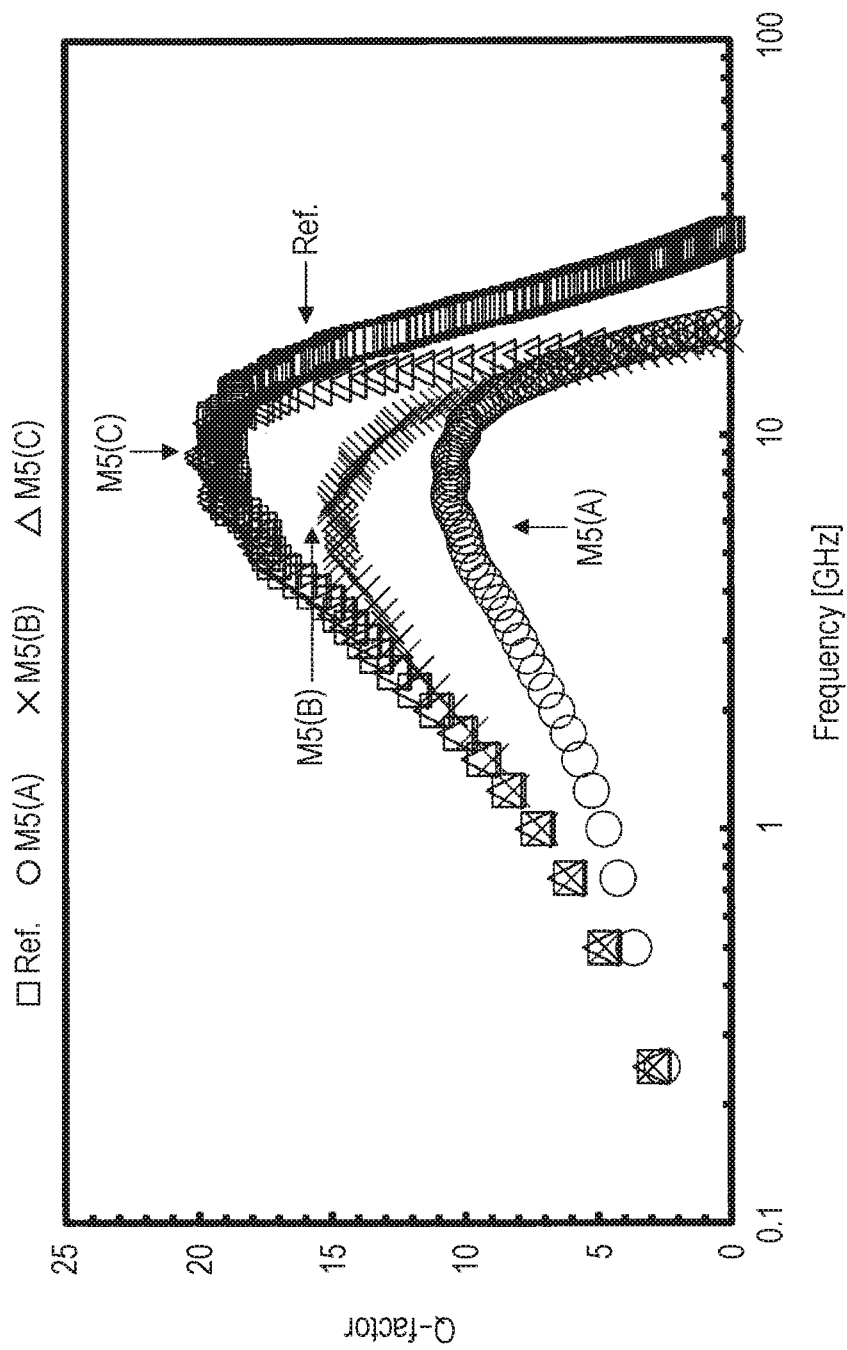
FIG. 8 is a graph for showing a Q-factor in the case where the wirings shown in FIGS. 7A to 7C are used.
Figure 9:
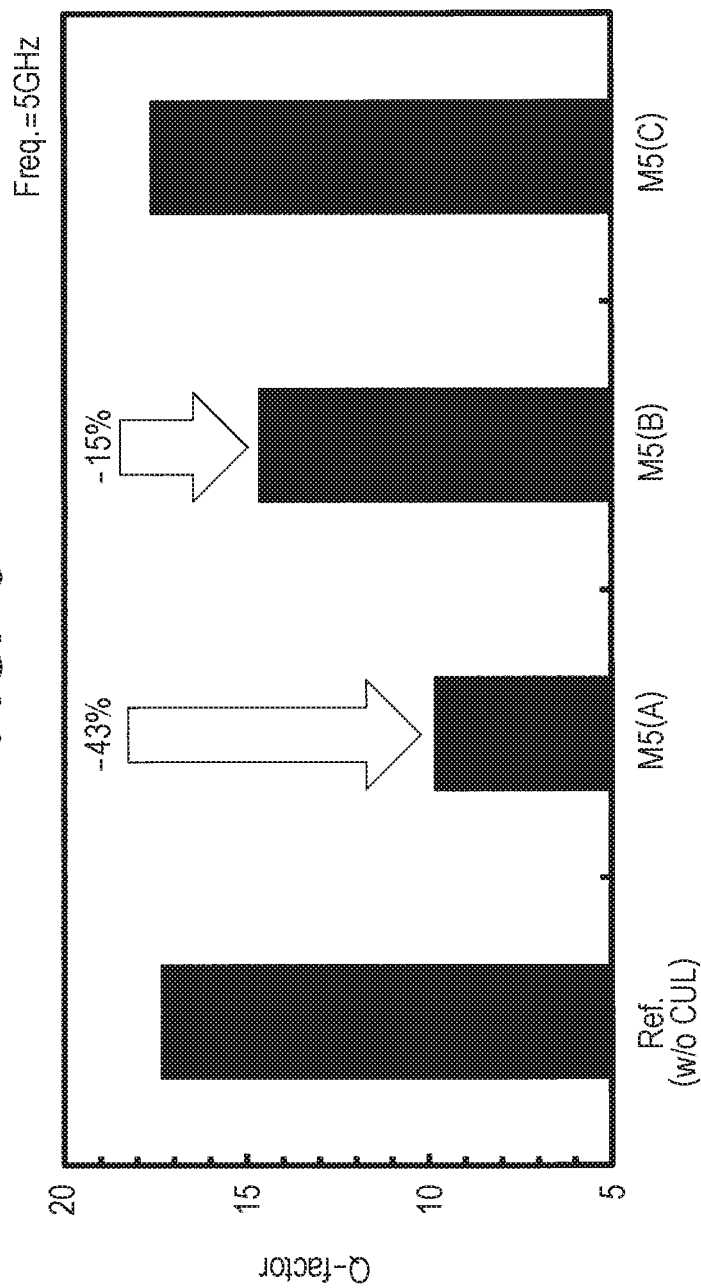
FIG. 9 is a graph for showing a Q-factor at 5 GHz.

FIG. 8 is a graph for showing a Q-factor in the case where the wirings shown in FIGS. 7A to 7C are used. The vertical axis represents a Q-factor, and the horizontal axis represents a frequency (GHz). FIG. 9 is a graph for showing a Q-factor at 5 GHz. The cases of the wiring layouts in FIG. 7A, FIG. 7B, and FIG. 7C are represented as M5 (A), M5 (B), M5 (C), respectively. In addition, Ref. denotes a reference in which the wirings M5 are not arranged.

Here, the Q-factor of the coil is a ratio of the inductive reactance of the coil to the resistance thereof at a specific frequency, and is a numerical value obtained by converting the performance of the coil. As the Q-factor of the coil is higher, the coil is close to an ideal inductor.

As shown in FIG. 8, in the wirings M5, a decrease in the Q-factor of M5 (A) was the largest, and a decrease in the Q-factor was small in the order of M5 (B) and M5 (C). Specifically, as shown in FIG. 8, the Q-factor was decreased from the reference by 43% in the layout of M5 (A) of the wirings M5 at 5 GHz, the Q-factor was decreased from the reference by 15% in the layout of M5 (B), and the Q-factor was about the same as the reference in the layout of M5 (C). The parasitic capacitances of M5 (A), M5 (B), and M5 (C) are almost the same.

In M5 (A), as shown in FIG. 7A, loop wirings (LP1, LP2, and the like) are formed between the linear wiring parts M5a to M5e and the guard ring GR. In this case, it is conceivable that an eddy current flowed into the loop wirings and the Q-factor was decreased.

Accordingly, it is preferable that the linear wiring parts (M5) are formed in a wiring shape having no loop wirings as shown in FIG. 7B and FIG. 7C. In other words, it is desirable that the linear wiring parts (M5) are formed in a wiring shape in which both ends are not closed. Specifically, for example, it is preferable that the linear wiring parts (M5) are formed in a wiring shape in which one end is coupled to the guard ring GR but the other end is not coupled thereto.

In addition, it can be understood from the comparison between FIG. 7B and FIG. 7C that a decrease in the Q-factor can be suppressed by forming the linear wiring parts (M5) in a wiring shape having no loop wirings and by setting the wiring width to 1 μm or smaller.

From the results described above, it was found that even if the linear wiring parts formed in a wiring shape having no loop wirings and having a wiring width of 1 μm or smaller were arranged under the coil (spiral inductor) CL, the Q-factor could be kept. This corresponds to the above-described first condition (shape condition).

Second Example

In a second example, the layout wirings shown in FIG. 7B were formed in a sixth wiring layer (M6 layer), a fifth wiring layer M5 (layer), and a third wiring M3 (layer) under the coil (spiral inductor) CL to compare the Q-factors.

Figure 10:
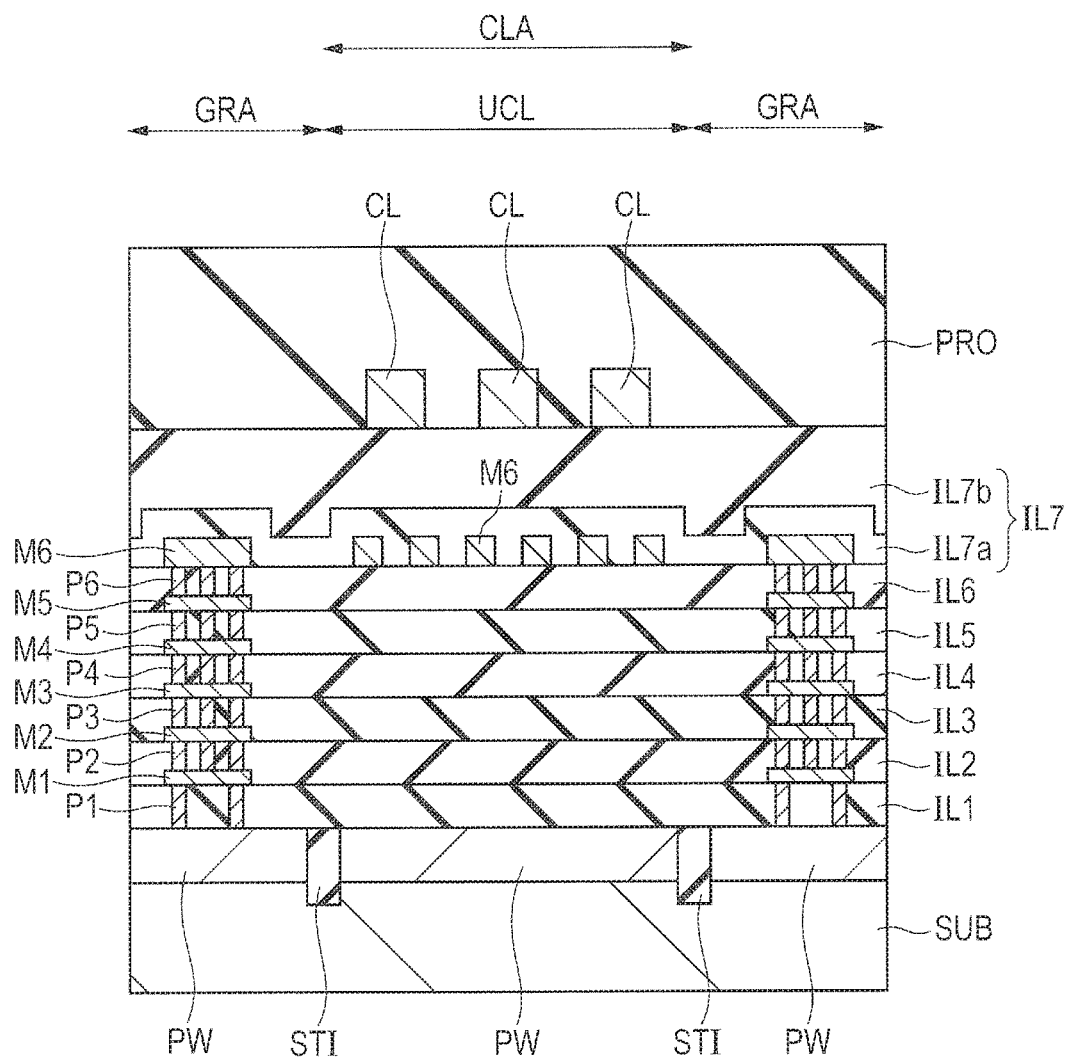
FIG. 10 is a cross-sectional view for showing a configuration of a semiconductor device of a second example.
Figure 11:
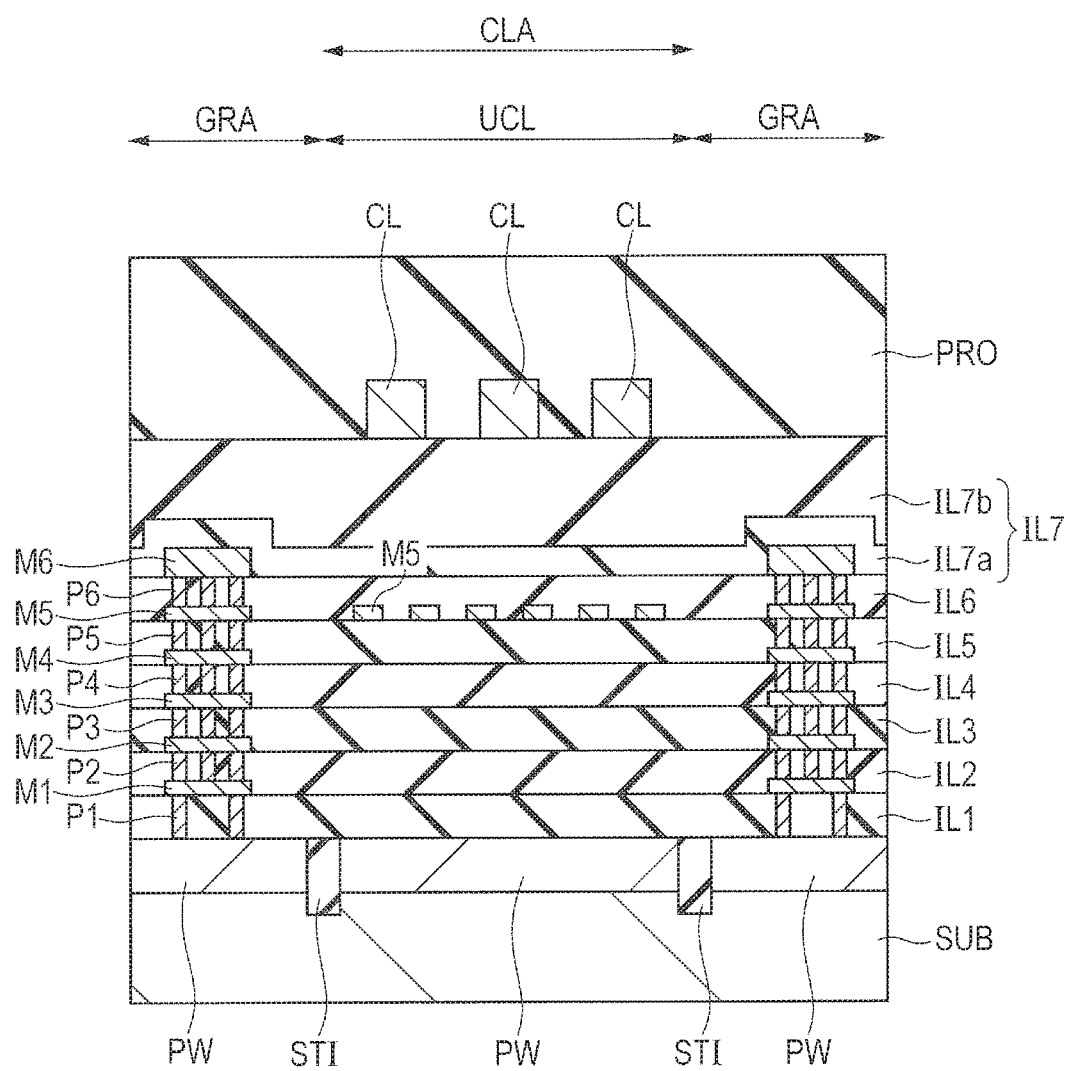
FIG. 11 is a cross-sectional view for showing a configuration of the semiconductor device of the second example.
Figure 12:
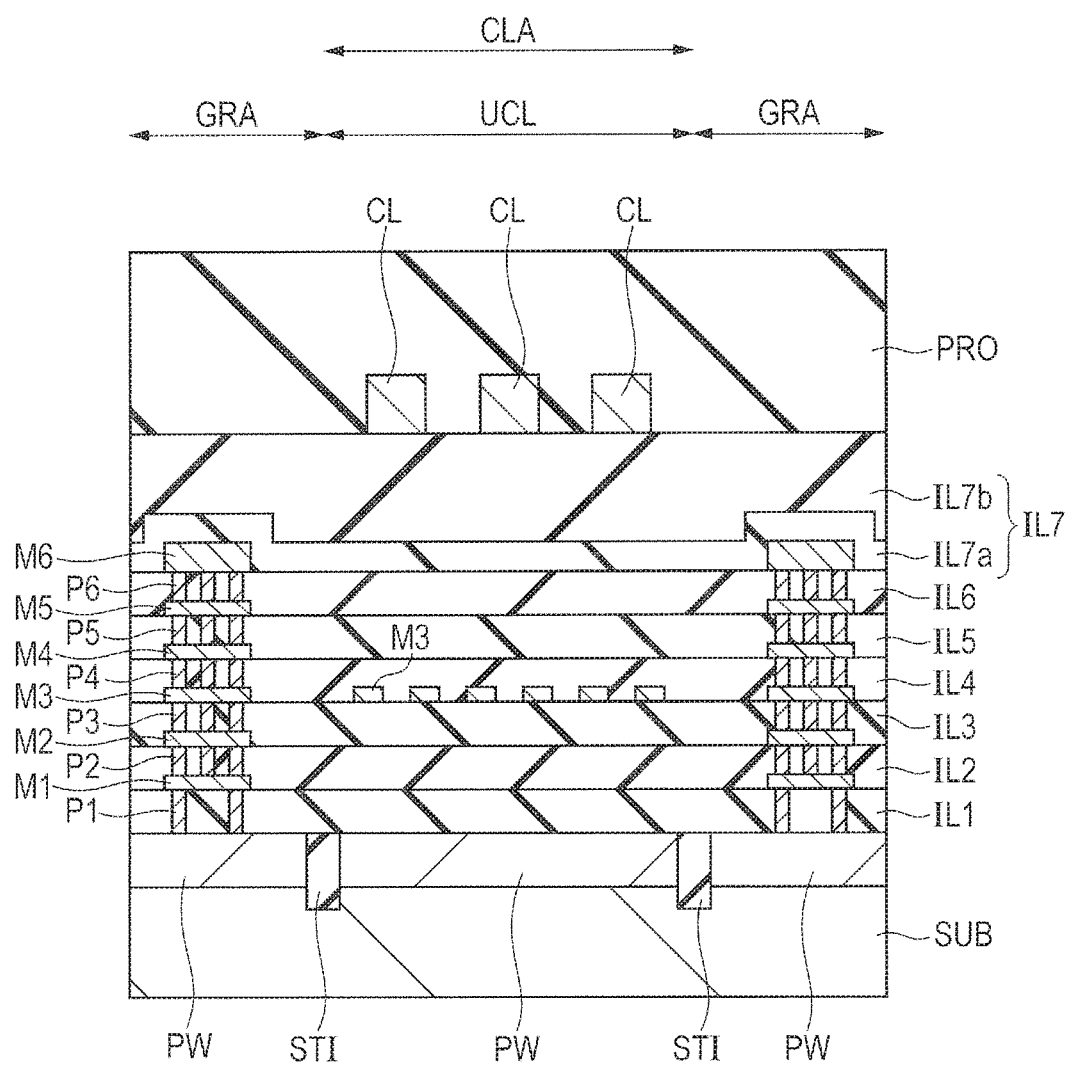
FIG. 12 is a cross-sectional view for showing a configuration of the semiconductor device of the second example.

FIG. 10 to FIG. 12 are cross-sectional views each showing a configuration of a semiconductor device of the example. FIG. 10 is a cross-sectional view in the case where the sixth wiring layer (M6 layer) is used, FIG. 11 is a cross-sectional view in the case where the fifth wiring layer (M5 layer) is used, and FIG. 12 is a cross-sectional view in the case where the third wiring layer (M3 layer) is used.

In the case where the sixth wiring layer (M6 layer) is used (FIG. 10), the distance between the wirings M6 and the coil CL is about 6 μm. In addition, in the case where the fifth wiring layer (M5 layer) is used (FIG. 11), the distance L between the wirings M5 and the coil CL is about 7 μm. In the case where the third wiring layer (M3 layer) is used (FIG. 12), the distance between the wirings M3 and the coil CL is about 8 μm.

Figure 13:
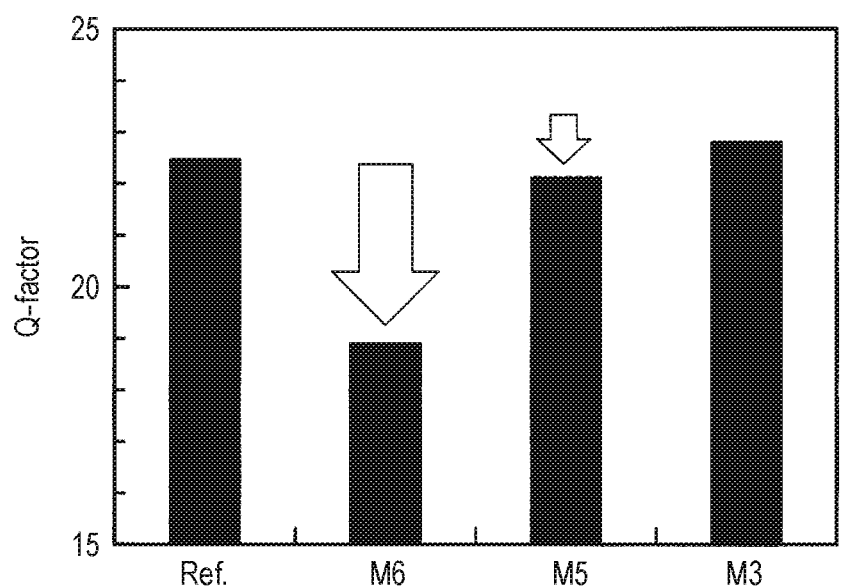
FIG. 13 is a graph for showing a Q-factor at 5 GHz in cases shown in FIG. 10 to FIG. 12.

FIG. 13 is a graph for showing a Q-factor at 5 GHz in cases shown in FIG. 10 to FIG. 12. The vertical axis represents a Q-factor. In FIG. 13, Ref. denotes a reference in which the wirings are not arranged.

As shown in FIG. 13, the Q-factor was increased in the order of the sixth wiring layer (M6 layer), the fifth wiring layer (M5 layer), and the third wiring layer (M3 layer). Specifically, as shown in FIG. 13, in the case where the sixth wiring layer (M6 layer) was used (FIG. 10), the Q-factor was decreased much lower than Ref. In addition, in the case where the fifth wiring layer (M5 layer) was used (FIG. 11), the Q-factor was slightly decreased than Ref. In addition, in the case where the third wiring layer (M3 layer) was used (FIG. 12), the Q-factor was about the same as Ref.

From the results described above, it was found that the distance L between the linear wiring parts and the coil CL was preferably 7 μm or larger. This corresponds to the above-described second condition (depth condition).

Accordingly, from the results of the first and second examples, as described with reference to FIG. 1, even if the wiring parts which are formed in a wiring shape having no loop wirings, which have a wiring width of 1 μm or smaller, and in which the distance L between the wirings and the coil CL is 7 μm or larger is arranged under the coil (spiral inductor) CL, the Q-factor of the coil (spiral inductor) CL can be suppressed from being decreased.

Third Example and Fourth Example

Figure 14:
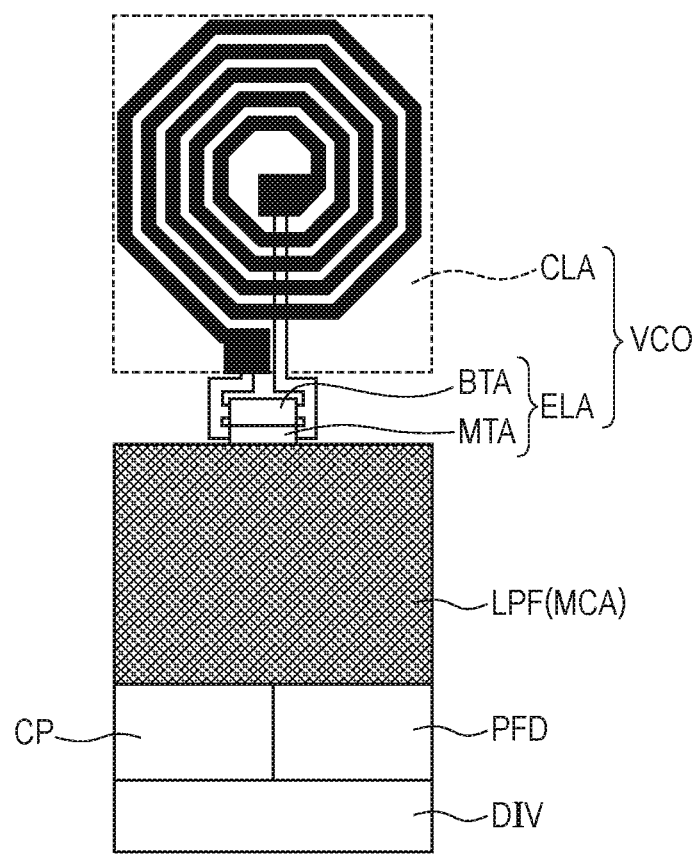
FIG. 14 is a plan view for showing a configuration of a PLL circuit of a comparative example.

FIG. 14 is a plan view for showing a configuration of a PLL circuit of a comparative example. As shown in FIG. 14, in the PLL circuit of the comparative example, a formation region CLA for the coil (spiral inductor) CL and an element region ELA are provided in the LC-VCO circuit VCO. In the element region ELA, a MOS varactor formation region BTA and a MOS transistor formation region MTA are provided.

As described above, circuit configuration blocks (PFD, CP, LPF, VCO, and DIV) are arranged side by side in planar view in the PLL circuit of the comparative example.

Figure 15A:
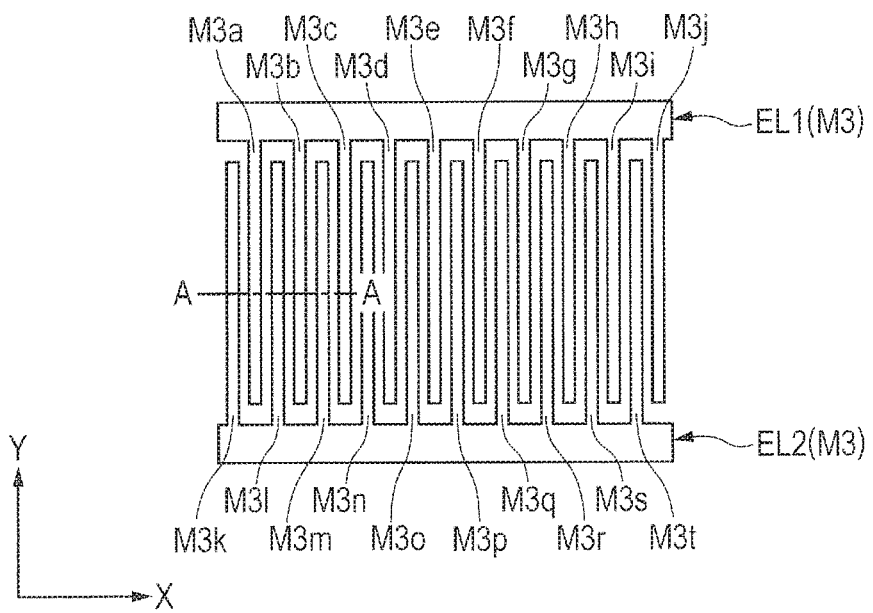
FIGS. 15A to 15B are diagrams each showing a configuration example of a MOM capacitance element configuring a loop filter.
Figure 15B:
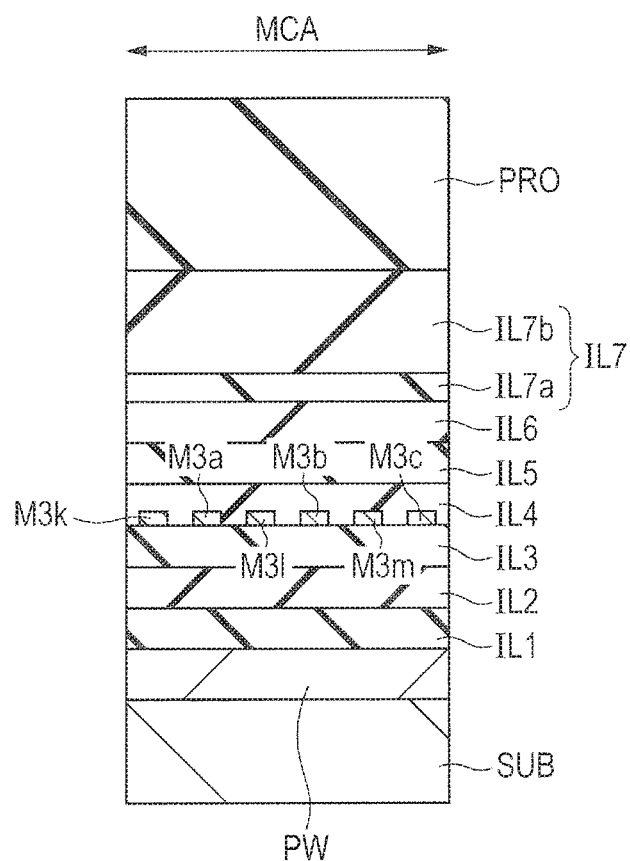

FIGS. 15A and 15B are diagrams each showing a configuration example of a MOM capacitance element configuring a loop filter LPF. FIG. 15A is a plan view, and FIG. 15B is a cross-sectional view. The cross-sectional view corresponds to a cross section A-A of the plan view.

As shown in FIG. 15A, the MOM capacitance element (MC) has a comb-like first electrode EL1 and a comb-like second electrode EL2. Specifically, the first electrode EL1 is configured using a plurality of linear wiring parts M3a to M3j. In other words, the first electrode EL1 has a plurality of rectangular wiring parts having long sides in the Y direction (vertical direction). Further, in other words, the linear wiring parts M3a to M3j are arranged at constant intervals in the X direction (horizontal direction). In addition, one end of each of the linear wiring parts M3a to M3j is coupled to a rectangular wiring part (an upper part in the drawing) having long sides in the X direction.

In addition, the second electrode EL2 is configured using a plurality of linear wiring parts M3k to M3t. In other words, the second electrode EL2 has a plurality of rectangular wiring parts having long sides in the Y direction. Further, in other words, the linear wiring parts M3k to M3t are arranged at constant intervals in the X direction. In addition, one end of each of the linear wiring parts M3k to M3t is coupled to a rectangular wiring part (a lower part in the drawing) having long sides in the X direction.

As shown in FIG. 15B, the comb-like first electrode EL1 and the comb-like second electrode EL2 are formed using the third wiring layer (the M3 layer). It should be noted that the comb-like first electrode EL1 and the comb-like second electrode EL2 may be formed using another wiring layer (the M1 layer, the M2 layer, the M4 layer, or the M5 layer). In addition, the comb-like first electrode EL1 and the comb-like second electrode EL2 may be formed using a plurality of wiring layers (for example, the M3 layer and the M4 layer).

Figure 16A:
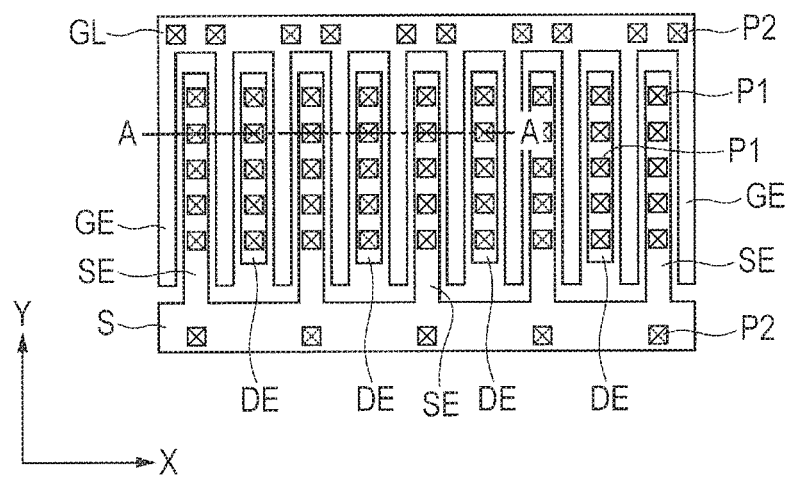
FIGS. 16A to 16B are diagrams each showing a configuration example of a MOS transistor configuring an LC-VCO circuit.
Figure 16B:
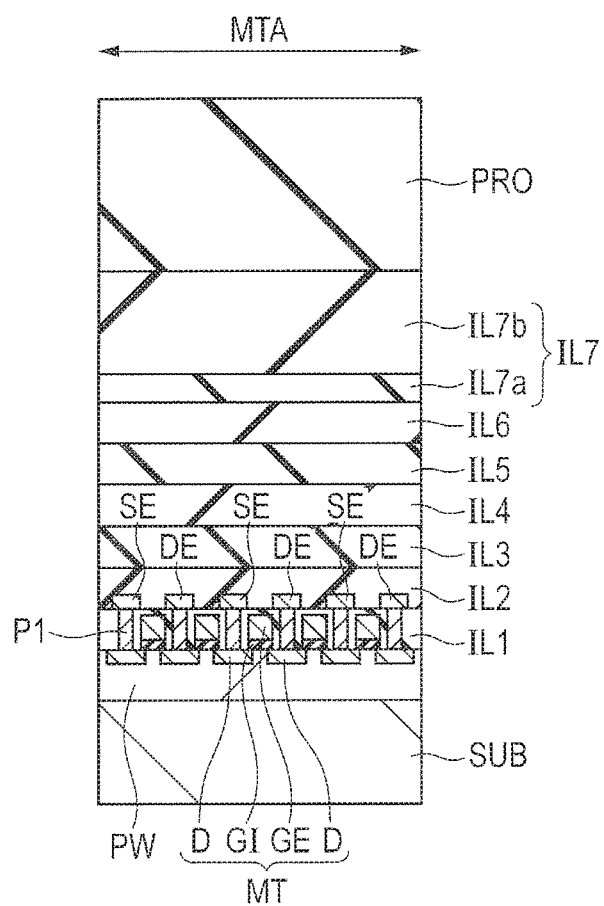

FIGS. 16A and 16B are diagrams each showing a configuration example of a MOS transistor configuring the LC-VCO circuit VCO. FIG. 16A is a plan view, and FIG. 16B is a cross-sectional view. The cross-sectional view corresponds to a cross section A-A of the plan view.

As shown in FIG. 16B, a MOS transistor MT has a gate electrode GE formed on a semiconductor substrate (p-type well PW) SUB through a gate insulation film GI and diffusion layers (n-type impurity regions) D formed in the semiconductor substrate (p-type well PW) SUB on both sides of the gate electrode GE. The diffusion layers D serve as source-drain regions of the MOS transistor MT. It should be noted that an n-type MOS transistor is shown as the MOS transistor MT in FIGS. 16A and 16B, but an n-type MOS transistor and a p-type MOS transistor are used in the LC-VCO circuit (see FIG. 4). The p-type MOS transistor has a gate electrode formed on a semiconductor substrate (n-type well) through a gate insulation film and diffusion layers (p-type impurity regions) formed in the semiconductor substrate (p-type well) on both sides of the gate electrode.

As shown in FIG. 16A, the gate electrodes GE are configured using a plurality of linear portions. In addition, one end of each of the linear portions is coupled to a gate line GL (an upper part in the drawing) extending in the X direction.

The diffusion layer (source region) D is arranged on one side of the gate electrode GE (FIG. 16B), and the diffusion layer (source region) D is formed in a rectangular shape having long sides in the Y direction. Further, a source electrode SE is arranged on the diffusion layer (source region) D. The source electrode SE is a rectangular wiring part having long sides in the Y direction. In addition, the diffusion layer (drain region) D is arranged on the other side of the gate electrode GE (FIG. 16B), and the diffusion layer (drain region) D is formed in a rectangular shape having long sides in the Y direction. Further, a drain electrode DE is arranged on the diffusion layer (drain region) D. The drain electrode DE is a rectangular wiring part having long sides in the Y direction. It should be noted that one end of each of a plurality of linear source electrodes SE is coupled to a rectangular source line S (a lower part in the drawing) having long sides in the X direction in FIG. 16A.

The diffusion layer (drain region) D and the source electrode SE are coupled to each other through a plug (P1). In addition, the diffusion layer (drain region) D and the drain electrode DE are coupled to each other through a plug (P1). It should be noted that plugs (P2) are provided on the gate line GL and the source line S.

Figure 17A:
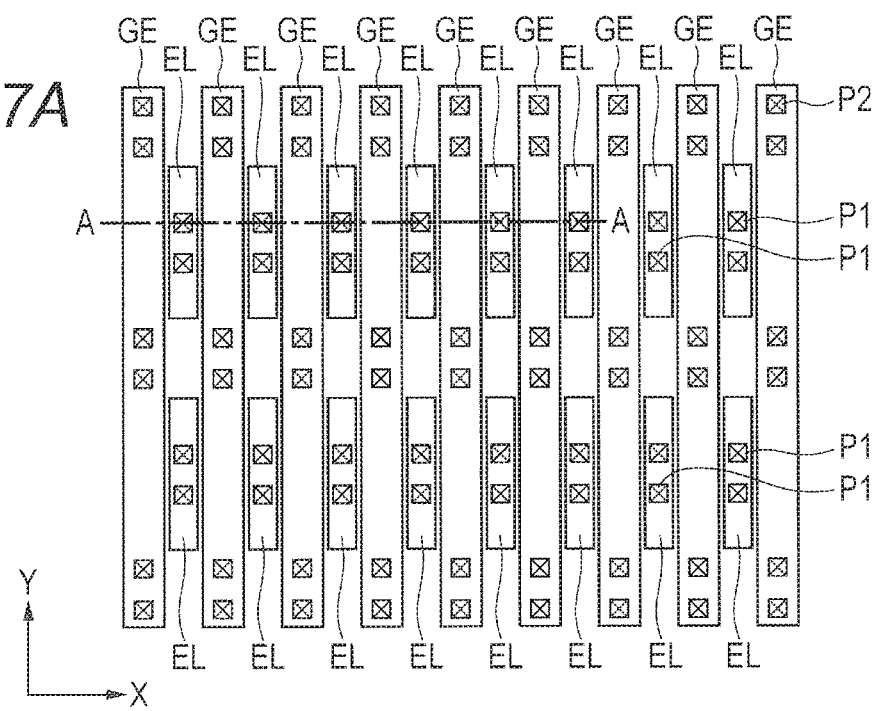
FIGS. 17A to 17B are diagrams each showing a configuration example of a MOS varactor configuring an LC-VCO circuit.
Figure 17B:
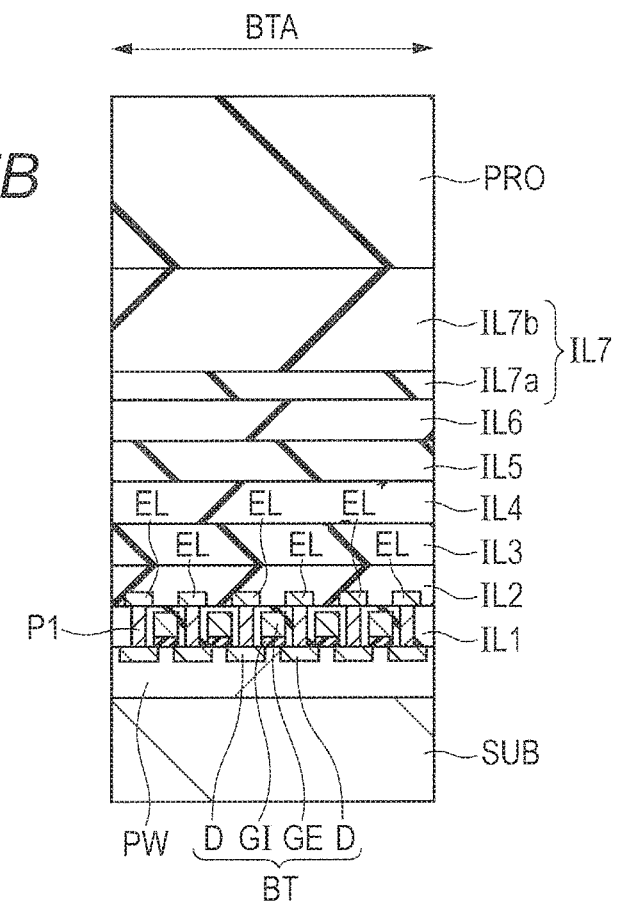

FIGS. 17A and 17B are diagrams each showing a configuration example of a MOS varactor configuring the LC-VCO circuit VCO. FIG. 17A is a plan view, and FIG. 17B is a cross-sectional view. The cross-sectional view corresponds to a cross section A-A of the plan view.

As shown in FIG. 17B, a MOS varactor BT is configured as similar to the MOS transistor (MT). The MOS varactor BT has a gate electrode GE formed on a semiconductor substrate (p-type well PW) SUB through a gate insulation film GI and diffusion layers (n-type impurity regions) D formed in the semiconductor substrate (p-type well PW) SUB on both sides of the gate electrode GE.

As shown in FIG. 17A, the gate electrodes GE are configured using a plurality of linear portions. The diffusion layers (n-type impurity regions) D are arranged on both sides of the gate electrode GE (FIG. 17B), and the diffusion layer (n-type impurity region) D is formed in a rectangular shape having long sides in the Y direction. In addition, an electrode EL is arranged on the diffusion layer (n-type impurity region) D. The electrode EL is a rectangular wiring part having long sides in the Y direction. The diffusion layer D and the electrode EL are coupled to each other through a plug (P1). It should be noted that a plug (P2) is provided on the gate electrode GE. Further, the diffusion layer D is coupled to the ground potential (GND). In other words, the electrode EL is coupled to the ground potential (GND). Further, in other words, the MOS varactor BT is a MOS transistor in which the source region and the drain region are short-circuited.

Figure 18A:
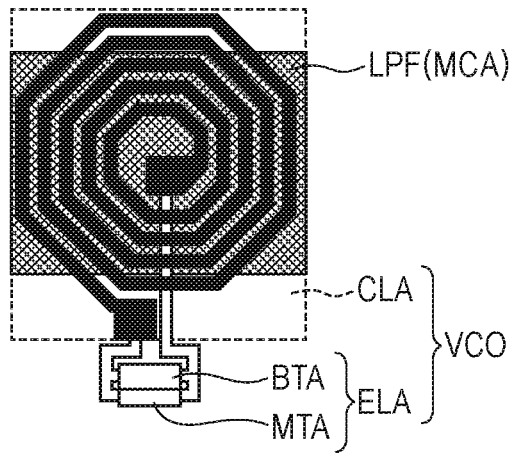
FIGS. 18A to 18C are diagrams each showing a configuration of a PLL circuit of a third example.
Figure 18B:
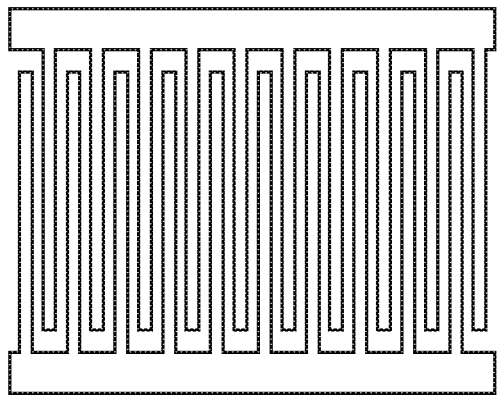
Figure 18C:
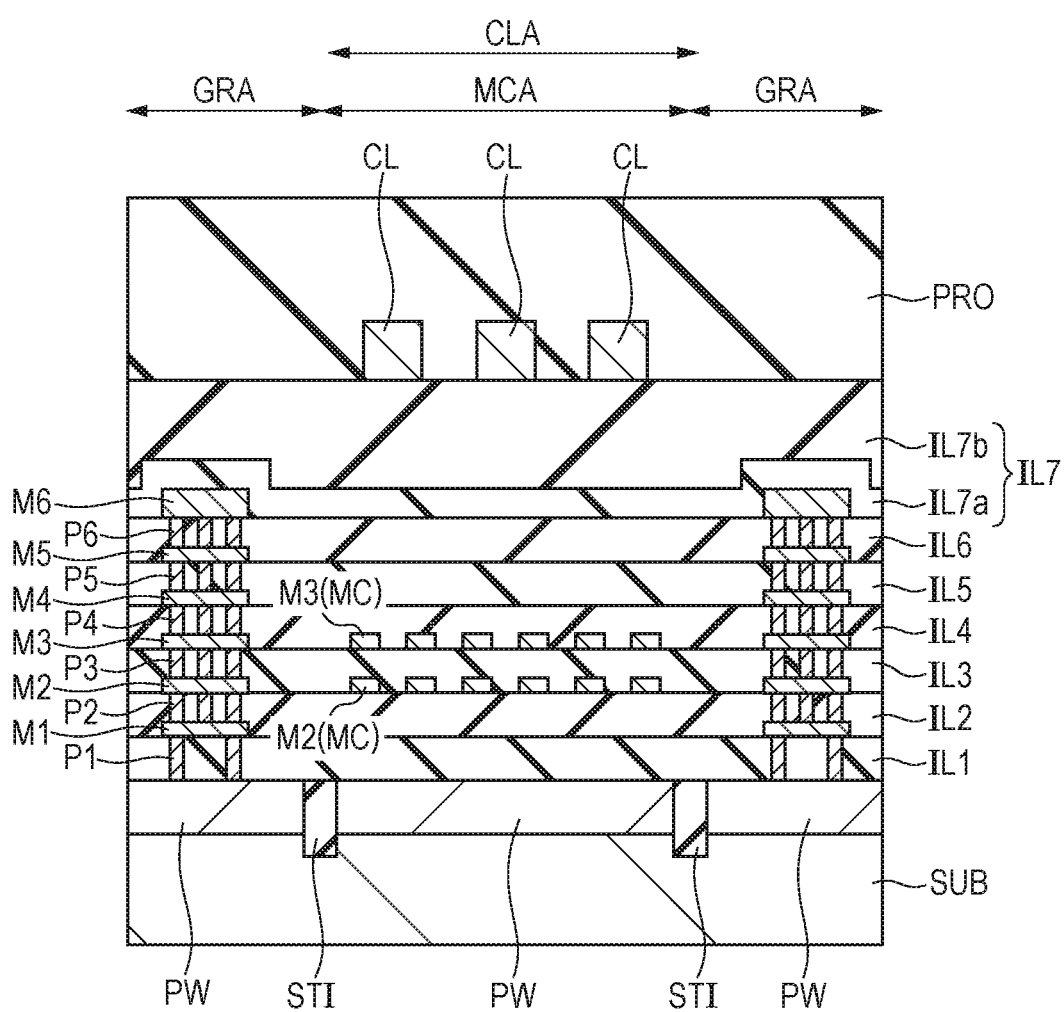

FIGS. 18A to 18C are diagrams each showing a configuration of a PLL circuit of the third example. FIG. 18A is a plan view for showing a configuration of the PLL circuit, FIG. 18B is a plan view for showing a configuration example of a MOM capacitance element configuring a loop filter LPF, and FIG. 18C is a cross-sectional view for schematically showing the MOM capacitance element and a coil (spiral inductor) CL.

In the PLL circuit of the third example, as shown in FIG. 18A, a formation region CLA for the coil (spiral inductor) CL and the loop filter LPF are arranged while being overlapped with each other. Specifically, the MOM capacitance element (MC) configuring the loop filter LPF is arranged under the coil (spiral inductor) CL.

As described above, the MOM capacitance element (MC) has the comb-like first electrode EL1 and the comb-like second electrode EL2 (see FIG. 15 and FIG. 18B). In the example, the MOM capacitance element (MC) configured using the comb-like first electrode EL1 and the comb-like second electrode EL2 is provided in each of the second wiring layer (M2 layer) and the third wiring layer (M3 layer) (FIG. 18C).

Figure 19A:
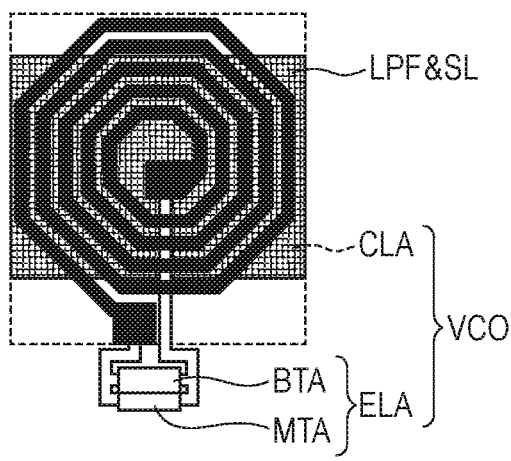
FIGS. 19A to 19C are diagrams each showing a configuration of a PLL circuit of a fourth example.
Figure 19B:
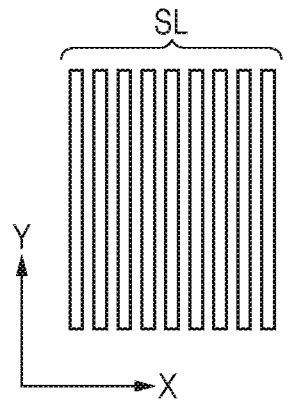
Figure 19C:
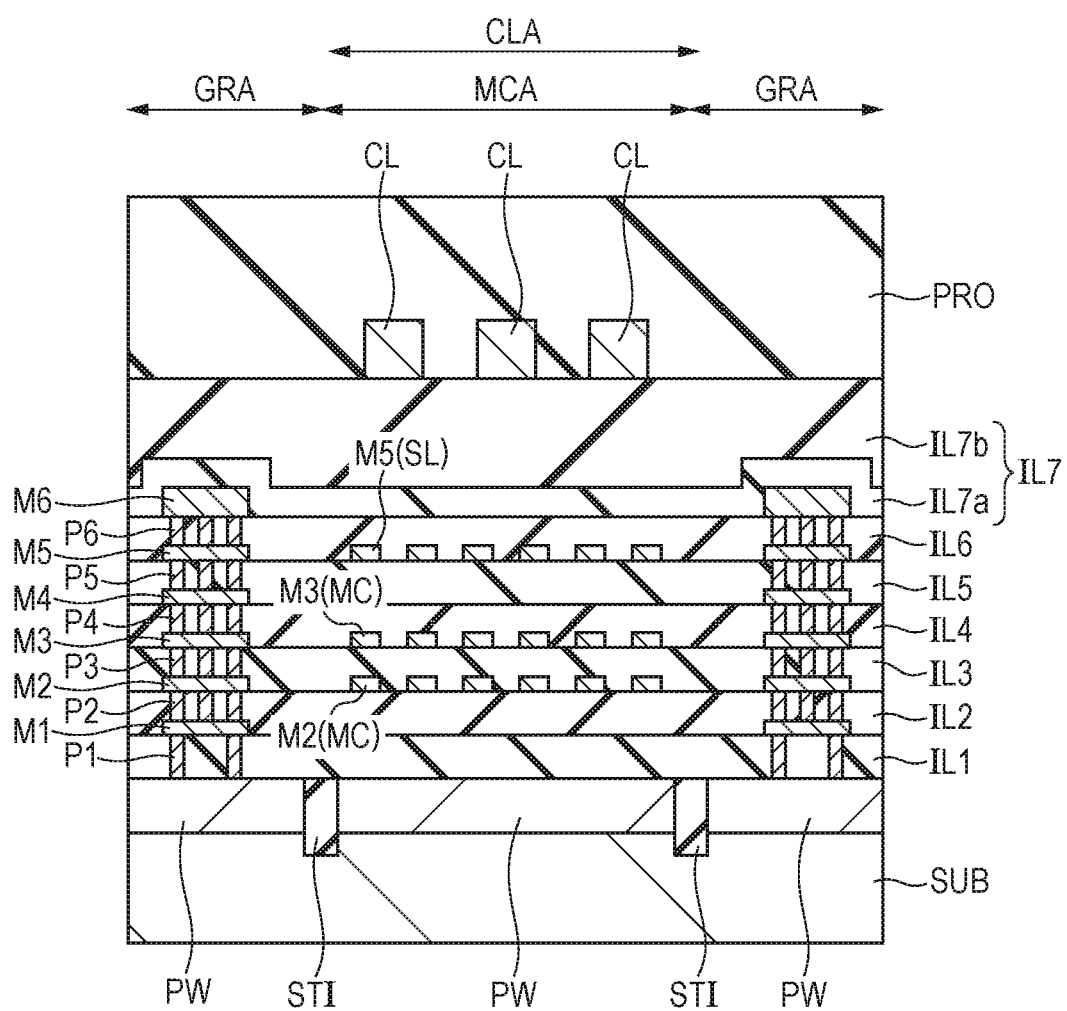

FIGS. 19A to 19C are diagrams each showing a configuration of a PLL circuit of the fourth example. FIG. 19A is a plan view for showing a configuration of the PLL circuit, FIG. 19B is a plan view for showing a configuration example of a shield layer SL arranged between the MOM capacitance element and the coil (spiral inductor) CL, and FIG. 19C is a cross-sectional view for schematically showing the MOM capacitance element, the shield layer SL, and the coil (spiral inductor) CL.

In the PLL circuit of the fourth example, as shown in FIG. 19A, the formation region CLA for the coil (spiral inductor) CL, the shield layer SL, and the loop filter LPF are arranged while being overlapped with each other. Specifically, the MOM capacitance element (MC) configuring the loop filter LPF and the shield layer SL are arranged under the coil (spiral inductor) CL.

In the example, as similar to the case of the third example, the MOM capacitance element (MC) configured using the comb-like first electrode EL1 and the comb-like second electrode EL2 is provided using each of the second wiring layer (M2 layer) and the third wiring layer (M3 layer). In addition, the shield layer SL is provided using the fifth wiring layer (M5 layer). The shield layer SL is configured using a plurality of linear wiring parts extending in the Y direction (FIG. 19B).

Figure 20:
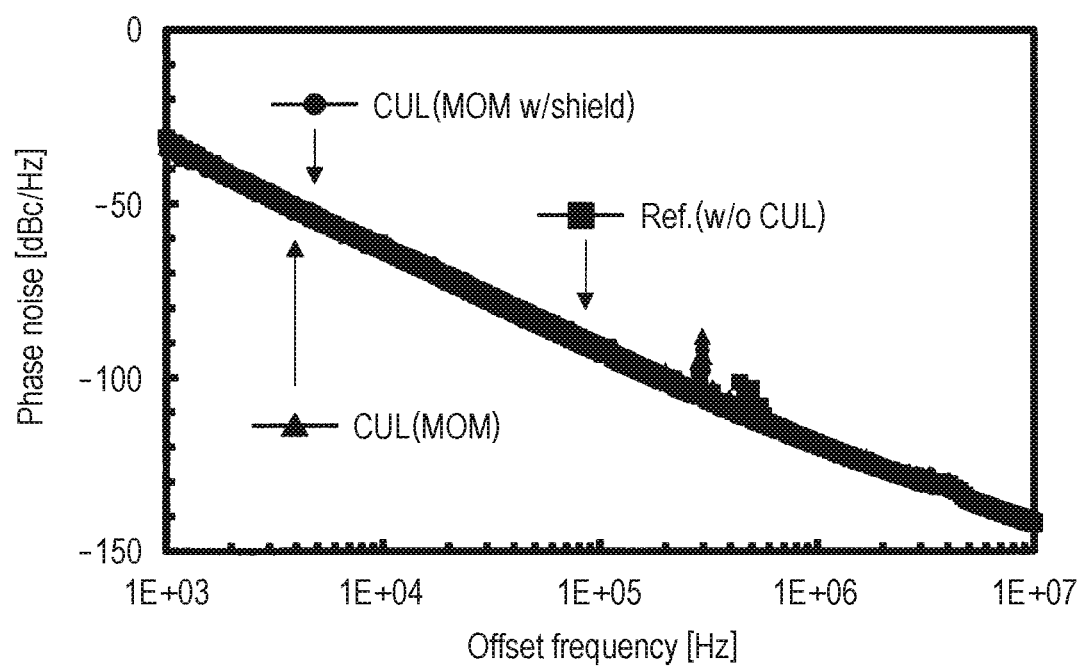
FIG. 20 is a graph for showing changes in phase noise for an offset frequency.

It should be noted that phase noise was checked in the above-described third and fourth examples under the conditions where the wiring width of each of the comb-like first electrode EL1 and the second electrode EL2 of the MOM capacitance element was 0.24 µm, the wiring interval was 0.24 µm, the wiring width of each wiring part of the shield layer SL was 1.0 µm, and the wiring interval was 1.0 µm. FIG. 20 is a graph for showing changes in phase noise for an offset frequency. Ref. (w/o CUL) represents a reference in which no wirings are arranged as CUL. Phase noise was verified in the case (CUL (MOM)) where the MOM capacitance element was arranged as CUL and in the case (CUL (MOM) w/ shield) where the MOM capacitance element and the shield layer were arranged as CUL. The result shows that changes similar to Ref. were observed in both cases as shown in FIG. 20, and phase noise was not deteriorated in both of the third and fourth examples.

Fifth Example

Figure 21A:
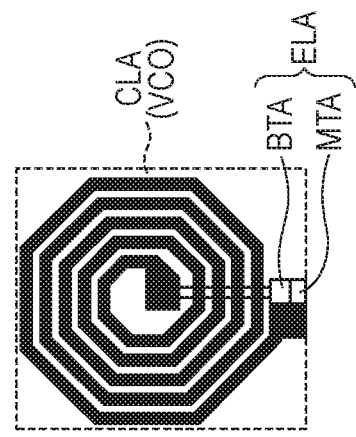
FIGS. 21A to 21B are diagrams each showing a configuration of an LC-VCO circuit of a fifth example.
Figure 21B:
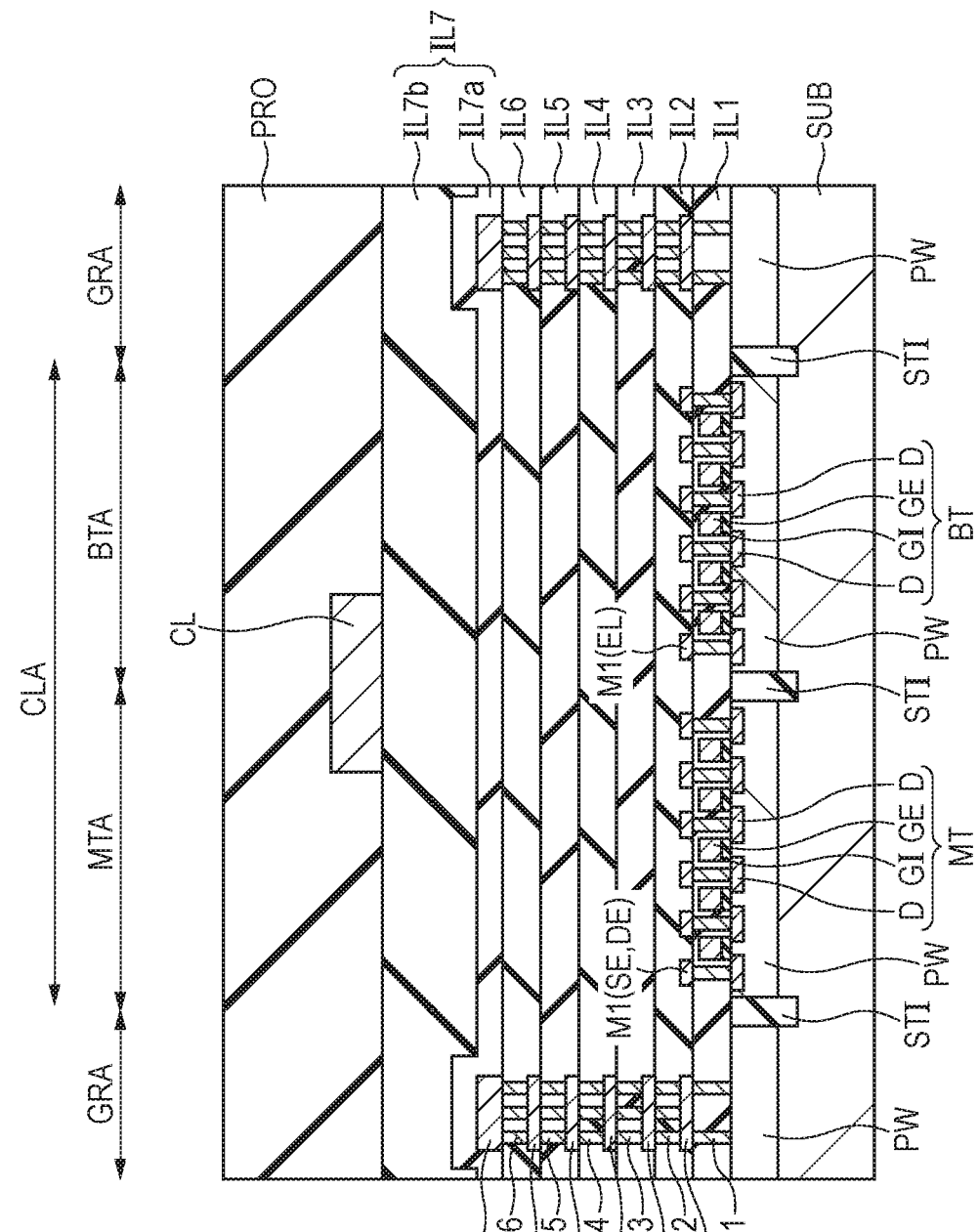

FIGS. 21A and 21B are diagrams each showing a configuration of an LC-VCO circuit of a fifth example. FIG. 21A is a plan view for showing a configuration of the LC-VCO circuit, and FIG. 21B is a cross-sectional view for schematically showing an element region ELA (a MOS varactor formation region BTA and a MOS transistor formation region MTA) and a coil (spiral inductor) CL.

In the LC-VCO circuit of the fifth example, a formation region CLA for the coil (spiral inductor) CL and the element region ELA (the MOS varactor formation region BTA and the MOS transistor formation region MTA) are arranged while being overlapped with each other. Specifically, a MOS transistor MT and a MOS varactor BT are arranged under the coil (spiral inductor) CL.

As described above, the MOS transistor MT and the MOS varactor BT have the linear wiring parts (SE, DE, and EL) M1 coupled to the diffusion layers D.

As described above, the MOS transistor MT has a gate electrode GE formed on a semiconductor substrate (p-type well PW) SUB through a gate insulation film GI and diffusion layers D formed in the semiconductor substrate (p-type well PW) SUB on both sides of the gate electrode GE. In addition, the MOS transistor MT has a source electrode SE and a drain electrode DE that are configured using a plurality of linear wiring parts (M1) extending in the Y direction (FIG. 21B).

Further, the MOS varactor BT has, as described above, a gate electrode GE formed on the semiconductor substrate (p-type well PW) SUB through a gate insulation film GI and diffusion layers D formed in the semiconductor substrate (p-type well PW) SUB on both sides of the gate electrode GE. In addition, the MOS varactor BT has an electrode EL configured using a plurality of linear wiring parts (M1) extending in the Y direction (FIG. 21B).

Figure 22:
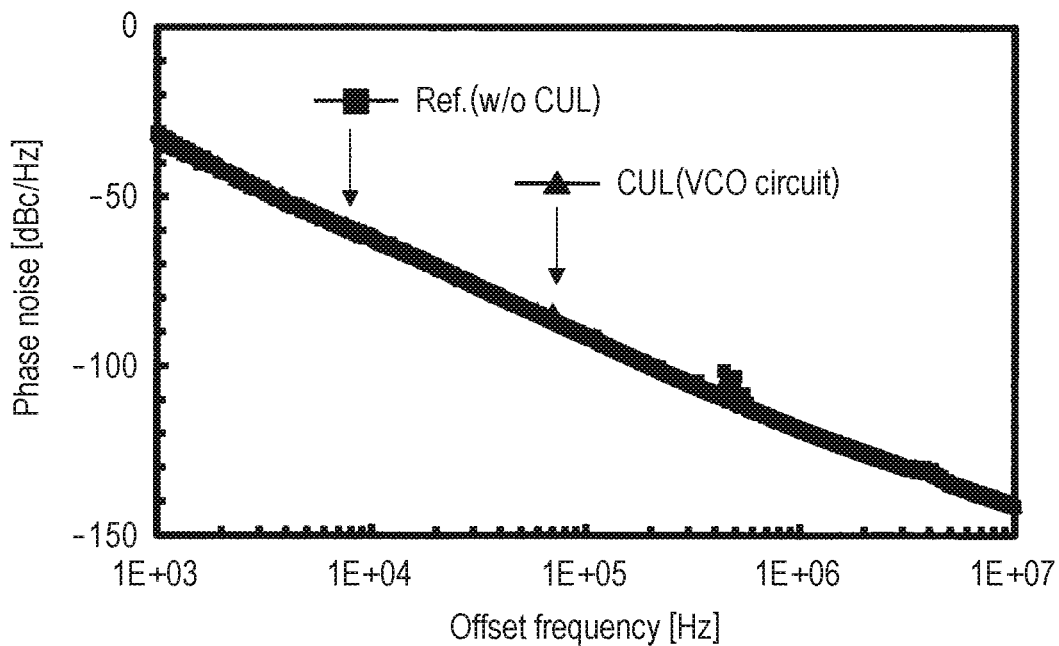
FIG. 22 is a graph for showing changes in phase noise for an offset frequency.

FIG. 22 is a graph for showing changes in phase noise for an offset frequency. Ref. (w/o CUL) represents a reference in which no wirings are arranged as CUL. Phase noise was verified in the case (CUL (VCO circuit)) where the MOS transistor and the MOS varactor were arranged as CUL. The result shows that changes similar to the reference were observed as shown in FIG. 22, and phase noise was not deteriorated in the example.

It should be noted that phase noise was verified in the case where loop wirings and wirings having a wiring width of 1 µm or larger were present. However, phase noise was not deteriorated as described above.

It is conceivable that the influence by the loop wirings and the wirings having a wiring width of 1 µm or larger was small because the element region ELA (the MOS varactor formation region BTA and the MOS transistor formation region MTA) had a small area (for example, 15% or smaller) as compared to the formation region CLA for the coil (spiral inductor) CL.

In addition, it is conceivable that the influence by the loop wirings and the wirings having a wiring width of 1 µm or larger was small because the element region ELA (the MOS varactor formation region BTA and the MOS transistor formation region MTA) was arranged at an end of the formation region CLA for the coil (spiral inductor) CL. In addition, it is conceivable that the influence by the loop wirings and the wirings having a wiring width of 1 µm or larger was small because the element region ELA (the MOS varactor formation region BTA and the MOS transistor formation region MTA) was partially overlapped with the coil (spiral inductor) CL.

Sixth Example

Figure 23:
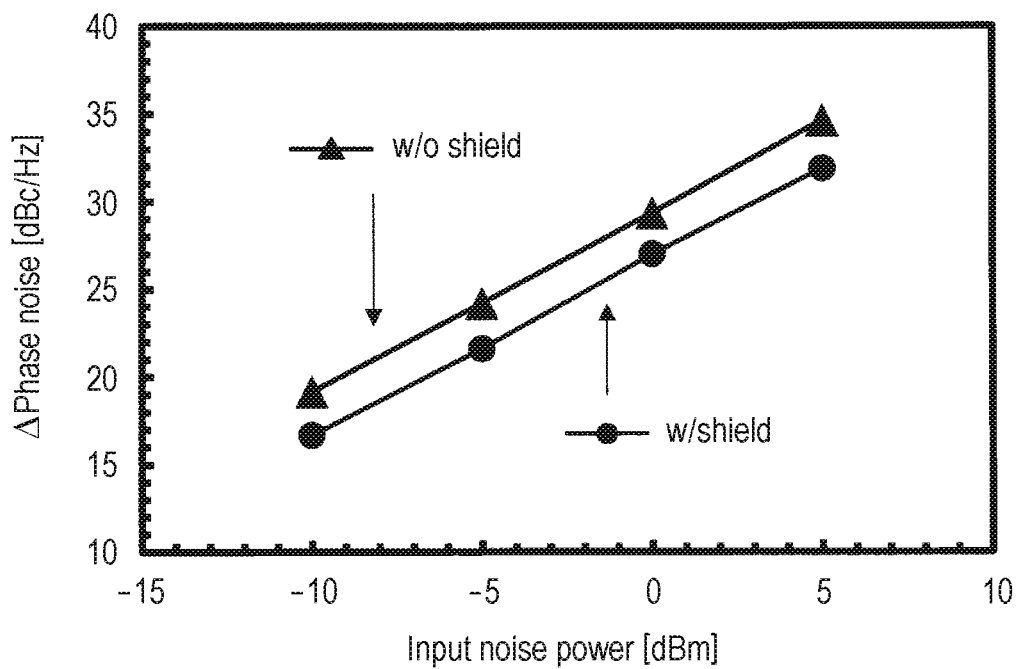
FIG. 23 is a graph for showing changes in phase noise for input noise.

FIG. 23 is a graph for showing changes in phase noise for input noise. A variation in phase noise was studied by inputting sinusoidal noise (power: −10, −5, 0, 5 dBm) at an offset frequency of 1 MHz. As shown in FIG. 23, the variation in phase noise was smaller in the case (w/ shield) where the shield layer SL was provided as compared to the case (w/o shield) where no shield layer SL was provided. For example, the variation in phase noise at an input voltage of 5 dBm was 34.7 dBc/Hz in the case where no shield layer SL was provided, and was 31.9 dBc/Hz in the case where the shield layer SL was provided.

Seventh Example

The characteristics of the PLL circuit and the LC-VCO circuit in the above-described examples are shown in Table 1.

TABLE 1

| | CUL | Freq. [GHz] | Phase noise [dBc/Hz] | Offset Freq. [MHz] | FoM [dBc/Hz] | PLL size reduction rate |
|---|---|---|---|---|---|---|
| Ref. | w/o | 2.67 | −119.0 | 1 | −182.0 | 1 |
| VCOs with CUL | MOM capacitor | 2.57 | −119.4 | 1 | −181.7 | 0.84 |
| | MOM capacitor w/ shield | 2.55 | −120.0 | 1 | −182.3 | 0.84 |
| | VCO circuit | 2.70 | −118.2 | 1 | −180.9 | 0.92 |
| | MOM capacitor and VCO circuit | — | — | — | — | 0.76 |

The first row corresponds to the reference, the second row corresponds to the third example, the third row corresponds to the fourth example, the fourth row corresponds to the fifth example, and the fifth row corresponds to a case of FIG. 25 to be described later. "Freq". is an abbreviation of frequency, "Offset Freq." is an abbreviation of offset frequency, and "FoM" is an abbreviation of Figure of Merit. In addition, "PLL size reduction rate" is an example of the area reduction rate of the PLL circuit.

Second Embodiment

[Description of Structure]

Figure 24:
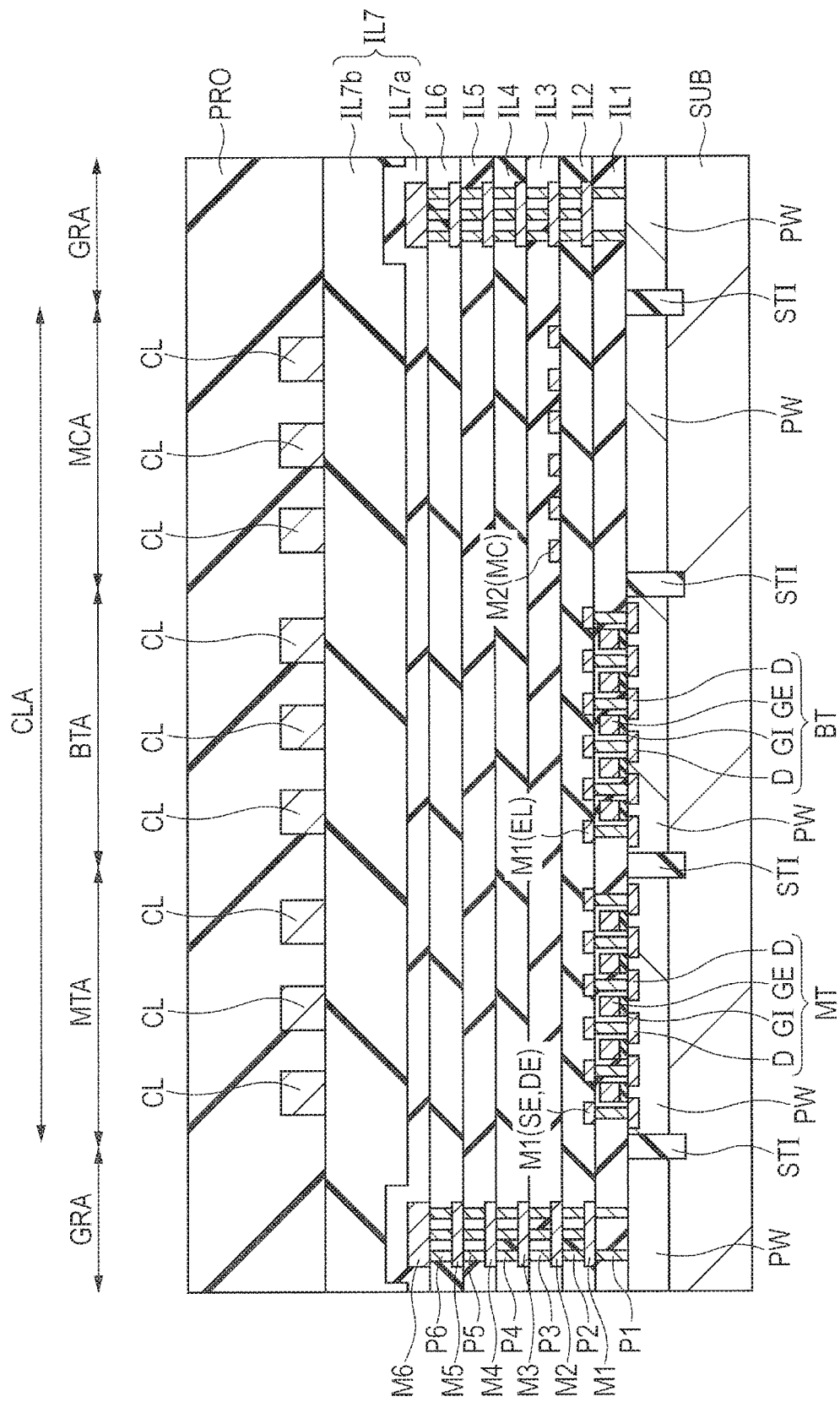
FIG. 24 is a cross-sectional view for schematically showing a configuration of a semiconductor device of a second embodiment.

FIG. 24 is a cross-sectional view for schematically showing a configuration of a semiconductor device of the embodiment. FIG. 25 is a plan view.

Figure 25:
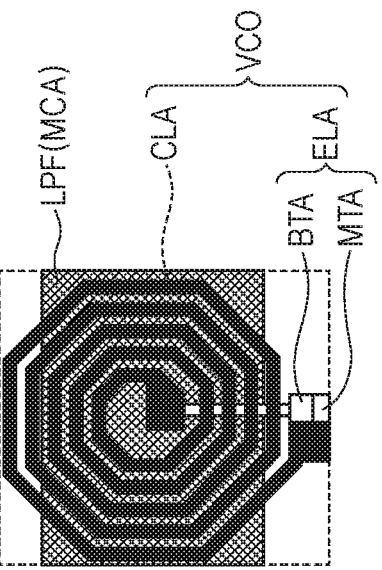
FIG. 25 is a plan view for schematically showing a configuration of the semiconductor device of the second embodiment.

As shown in FIG. 24 and FIG. 25, a formation region CLA for a coil (spiral inductor) CL and a loop filter LPF are arranged while being overlapped with each other in the embodiment (PLL circuit). Specifically, MOM capacitance elements (MC and M2) configuring the loop filter LPF are arranged under the coil (spiral inductor) CL.

In addition, the formation region CLA for the coil (spiral inductor) CL and a MOS varactor formation region BTA are arranged while being overlapped with each other in the embodiment (PLL circuit). Specifically, a MOS varactor BT configuring an LC-VCO circuit is arranged under the coil (spiral inductor) CL.

In addition, the formation region CLA for the coil (spiral inductor) CL and a MOS transistor formation region MTA are arranged while being overlapped with each other in the embodiment (PLL circuit). Specifically, a MOS transistor MT configuring the LC-VCO circuit is arranged under the coil (spiral inductor) CL.

As described above, by arranging the MOM capacitance element, the MOS varactor, and the MOS transistor under the coil (spiral inductor) CL, it is possible to reduce the area of the semiconductor device while keeping the characteristics (for example, RF characteristics) of the semiconductor device as described in the examples of the first embodiment.

[Description of Manufacturing Method]

Next, a manufacturing method of the semiconductor device of the embodiment will be described with reference to FIG. 26 to FIG. 32, and the configuration of the semiconductor device will be further clarified. FIG. 26 to FIG. 32 are cross-sectional views for showing manufacturing steps of the semiconductor device of the embodiment.

Figure 26:
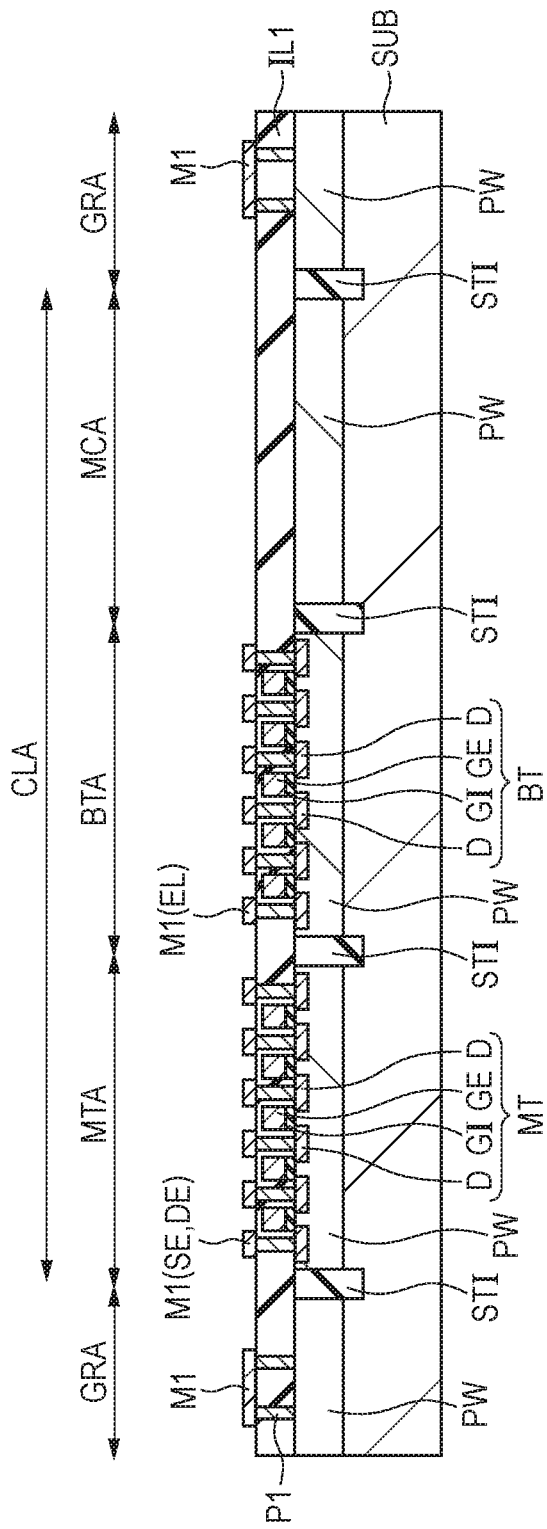
FIG. 26 is a cross-sectional view for showing a manufacturing step of a semiconductor device of a third embodiment.

As shown in FIG. 26, the semiconductor substrate SUB is prepared. The semiconductor substrate SUB is, for example, a single crystal silicon substrate.

The semiconductor substrate SUB has the region MCA in which the MOM capacitance element configuring the loop filter LPF is formed, the region MTA in which the MOS transistor MT configuring the LC-VCO circuit is formed, and the region BTA in which the MOS varactor BT configuring the LC-VCO circuit is formed.

In addition, the semiconductor substrate SUB has the region CLA in which the coil (spiral inductor) CL is formed, and the region GRA which is located at the outer periphery of the region CLA and in which the guard ring GR is formed.

First, an element separation region STI is formed in the semiconductor substrate SUB. For example, a trench is formed by dry-etching of an element separation region of the semiconductor substrate SUB. Next, for example, an oxide silicon film as an insulation film is deposited on the semiconductor substrate SUB including the inside of the trench by the CVD (Chemical Vapor Deposition) method and the like. Next, the oxide silicon film is polished by the CMP (Chemical Mechanical Polishing) method and the like until the semiconductor substrate SUB is exposed. Thereby, the element separation region STI is formed.

The element separation region STI is formed so as to surround, for example, each region (MTA, BTA, and MCA).

Next, the MOS transistor MT and the MOS varactor BT are formed in the regions MTA and BTA, respectively. The formation method of these is not limited, but these can be formed by, for example, the following step.

First, a p-type well PW is formed in the semiconductor substrate SUB by the ion implantation method. Next, the gate electrode GE is formed on the main surface of the semiconductor substrate SUB through the gate insulation film GI. For example, the gate insulation film GI formed using an oxide silicon film is formed by thermal oxidation of the surface of the semiconductor substrate SUB. Next, for example, a polycrystalline silicon film is formed on the gate insulation film GI by the CVD method and like, and the polycrystalline silicon film is patterned using a photolithography technique and an etching technique to form the gate electrode GE. Next, n-type impurities are ion-implanted into the semiconductor substrate (p-type well PW) SUB on both sides of each gate electrode GE to form the diffusion layer D formed using an n-type semiconductor region.

It should be noted that the diffusion layer D may be of an LDD structure. The diffusion layer having the LDD structure is configured using a low-concentration impurity region and a high-concentration impurity region. For example, after the low-concentration impurity region is formed by ion implantation of impurities into the wells on both sides of the gate electrode GE, sidewall films are formed on the sidewalls of the gate electrode GE to form the high-concentration impurity region in the wells on both sides of a composite of the gate electrode GE and the sidewall films.

Next, an annealing process (heat process) is performed to activate the impurities introduced by ion implantation so far.

By doing so, the MOS transistor MT and the MOS varactor BT can be formed in the regions MTA and BTA, respectively. Thereafter, a metal silicide layer (not shown) may be formed on the gate electrode GE and the diffusion layer D by the Salicide (Self Aligned Silicide) technique if necessary.

Next, an interlayer insulation film IL1 is formed on the main surface (entire main surface) of the semiconductor substrate SUB. For example, after an oxide silicon film is deposited on the MOS transistor MT and the MOS varactor BT by the CVD method, the surface of the interlayer insulation film IL1 is flattened using the CMP method and the like if necessary.

Next, the plug P1 is formed in the interlayer insulation film IL1. For example, the interlayer insulation film IL1 is dry-etched by using a photoresist layer (not shown) formed on the interlayer insulation film IL1 using the photolithography technique as an etching mask, so that a contact hole (a through-hole or a hole) is formed in the interlayer insulation film IL1. Next, a conductive film is buried into the contact hole to form the conductive plug (conductive part for connection) P1. It should be noted that the plug P1 may be formed on the gate electrode GE.

Next, the wirings M1 configured using a conductive film are formed on the plug P1. For example, an aluminum film as a conductive film is deposited on the interlayer insulation film IL1 and the plug P1 using the sputtering method and the like. Next, the conductive film is patterned using the photolithography technique and the etching technique to form the wirings M1 on the plug P1. It should be noted that the plug P1 configuring the guard ring GR and the wirings M1 are formed in the region GRA in this step.

Figure 27:
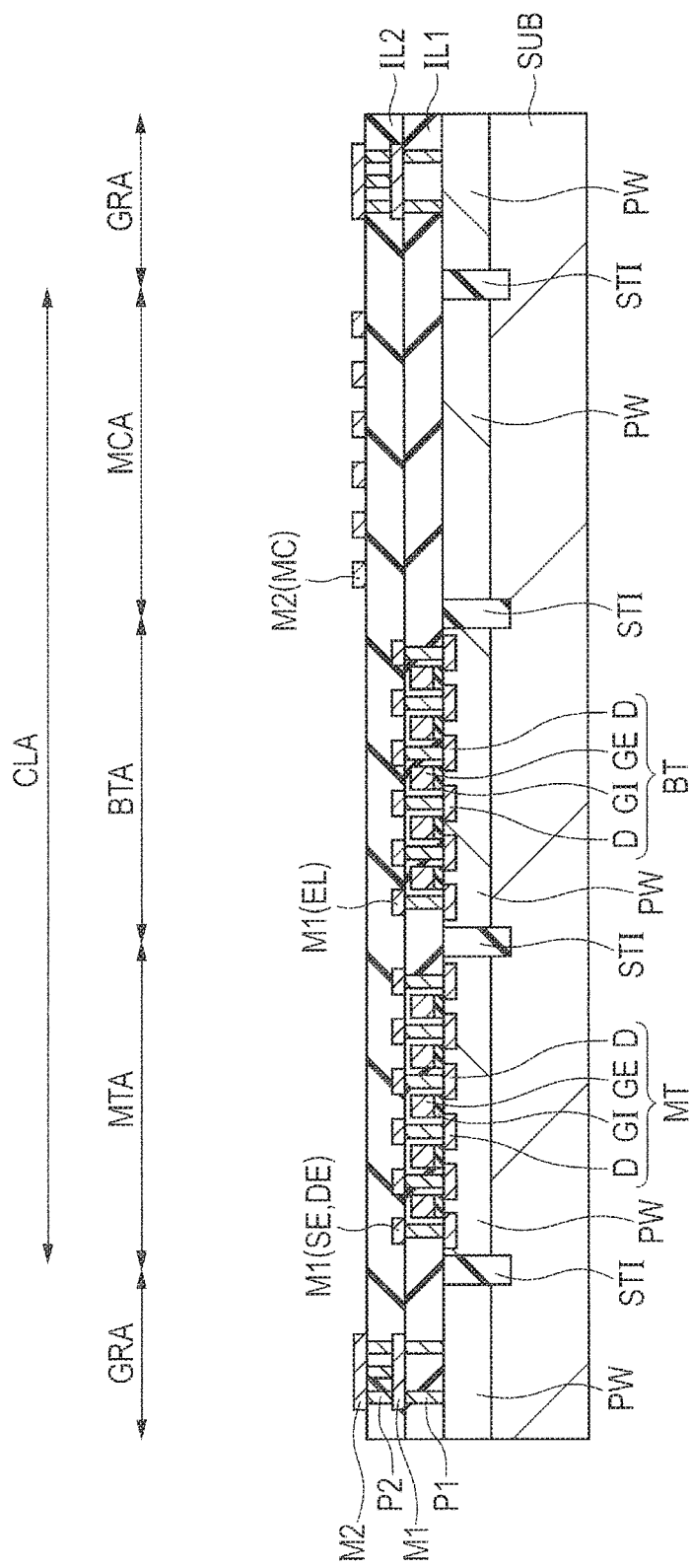
FIG. 27 is a cross-sectional view for showing a manufacturing step of the semiconductor device of the third embodiment.

Next, as shown in FIG. 27, an interlayer insulation film IL2 is formed on the wirings M1. For example, an oxide silicon film is deposited on the wirings M1 by the CVD method and the like. Next, the interlayer insulation film IL2 is patterned to form the contact hole on the wirings M1, and further a conductive film is buried inside the contact hole to form a plug P2 in the interlayer insulation film IL2. Next, an aluminum film as a conductive film is deposited on the plug P2, and then is patterned to form the wirings M2. Here, the wirings M2 configure the guard ring GR. In addition, the wirings M2 in the region MCA configure the MOM capacitance element (MC).

Figure 28:
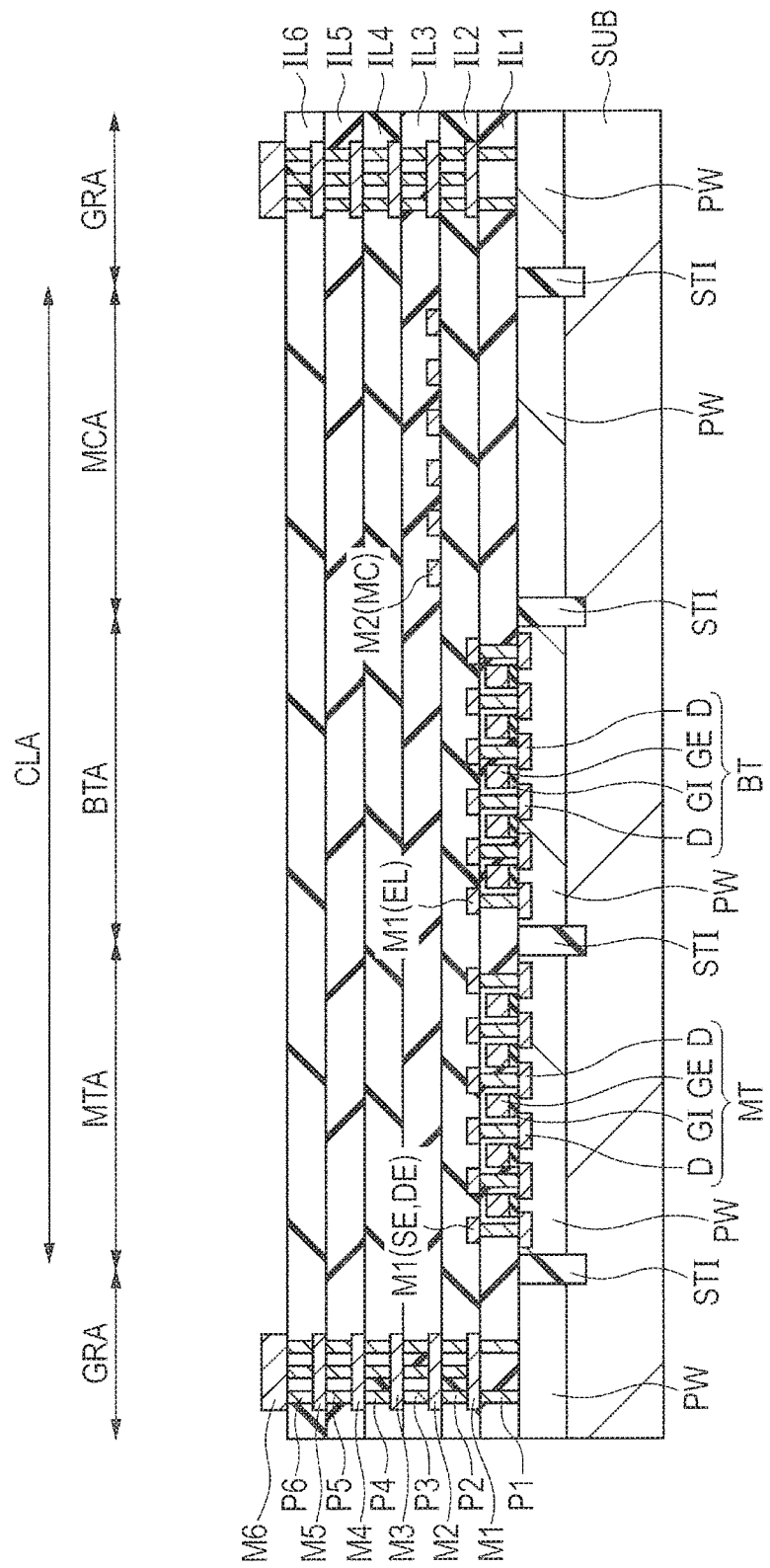
FIG. 28 is a cross-sectional view for showing a manufacturing step of the semiconductor device of the third embodiment.

Next, by repeating the formation steps of the interlayer insulation film, the plug, and the wiring, the plugs (P3 to P6) configuring the guard ring GR and the wirings (M3 to M6) are formed. The wirings M6 are formed thicker than the wirings (M1 to M5), and are the wirings of the uppermost layer among those configured using aluminum films (FIG. 28).

Figure 29:
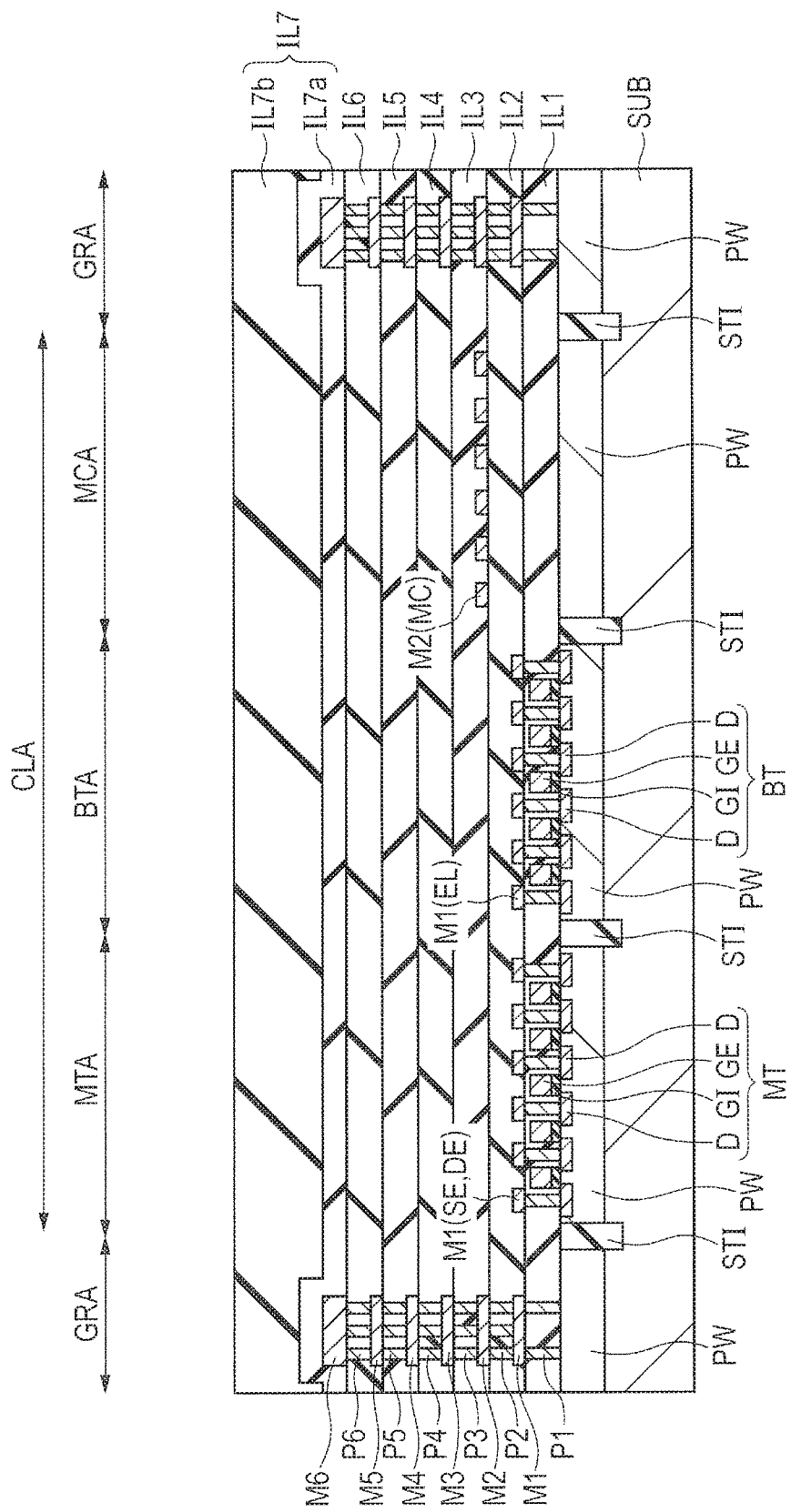
FIG. 29 is a cross-sectional view for showing a manufacturing step of the semiconductor device of the third embodiment.

Next, as shown in FIG. 29, an insulation film IL7a is formed on the wirings M6 and the interlayer insulation film IL6. For example, a nitride silicon film is deposited by the CVD method and the like. Next, the insulation film IL7a is coated with, for example, a photosensitive polyimide film as an insulation film IL7b. Next, a pad region that does not appear in the cross section of FIG. 29 is formed. Namely, a photosensitive polyimide film is exposed and developed to remove a polyimide film in the pad region, and an opening part (an opening region or an exposed part of the sixth wirings M6) is formed. A heat process is performed thereafter to cure the polyimide film. Thereby, the interlayer insulation film IL7 having the opening part in the pad region and configured using a lamination film of the insulation film IL7a and the insulation film IL7b is formed (see FIG. 34 and the like to be described later).

Figure 30:
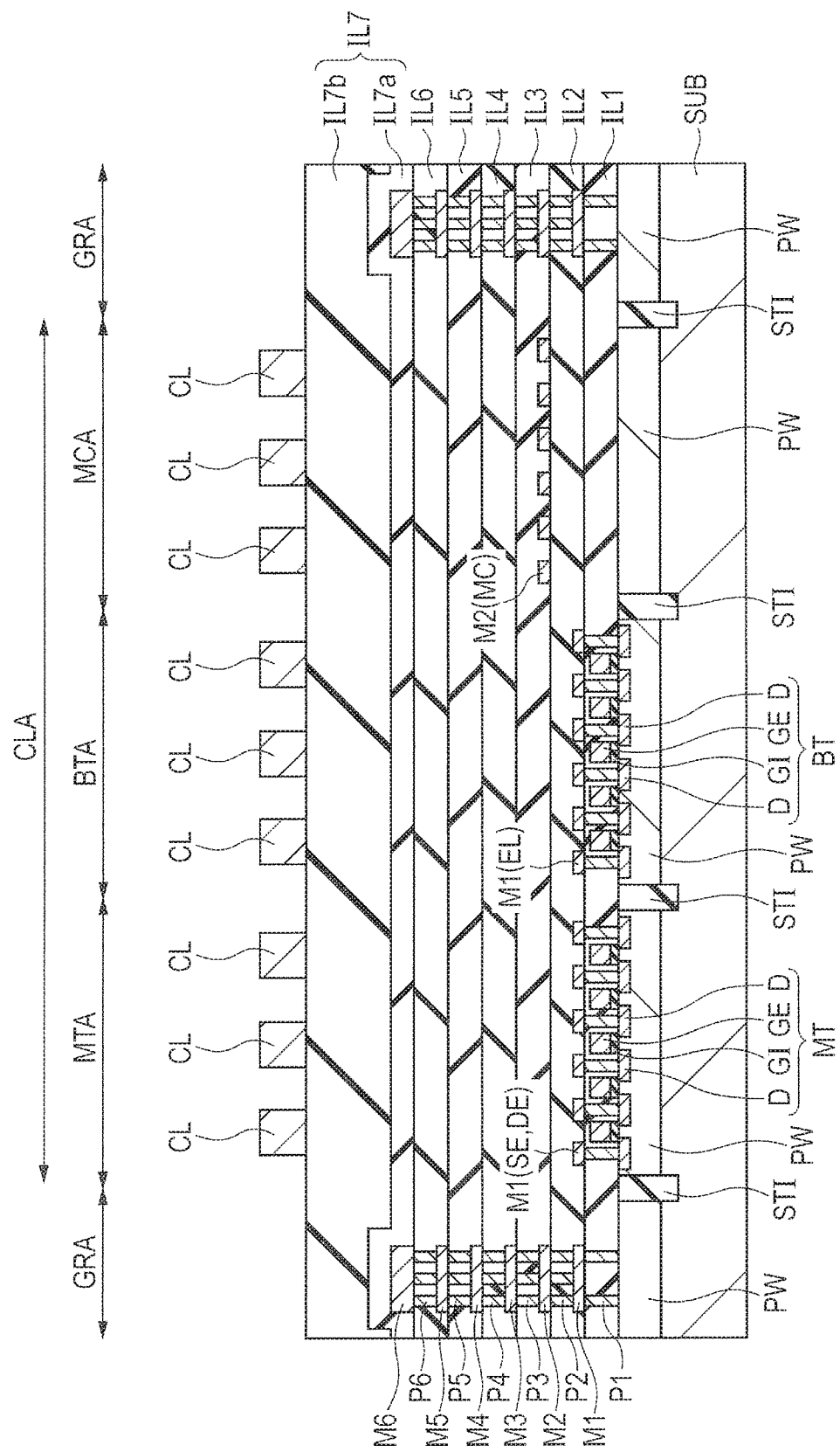
FIG. 30 is a cross-sectional view for showing a manufacturing step of the semiconductor device of the third embodiment.

Next, as shown in FIG. 30, the re-wiring (not shown) and the coil (inductor) CL are formed on the insulation film IL7b including the pad region (not shown). The re-wiring (not shown) and the coil (inductor) CL are formed by growing a Cu film (copper film) by, for example, the electrolytic plating method.

Next, for example, a photosensitive polyimide film as an insulation film (protection film) PRO is formed on the re-wiring (not shown), the coil (inductor) CL, and the interlayer insulation film IL7 (FIG. 24).

Thereafter, the wafer-like semiconductor substrate SUB is diced for each chip region to be divided (fragmented) into a plurality of semiconductor chips. Thereby, a semiconductor chip is obtained from each chip region of the semiconductor substrate SUB (semiconductor wafer). It should be noted that the back surface of the semiconductor substrate SUB may be ground to make the semiconductor substrate SUB thinner before dicing.

Then, a pad region of the cut-out semiconductor chip is coupled to a terminal of another semiconductor chip or a mounting substrate through a wire or the like.

Third Embodiment

Figure 31:
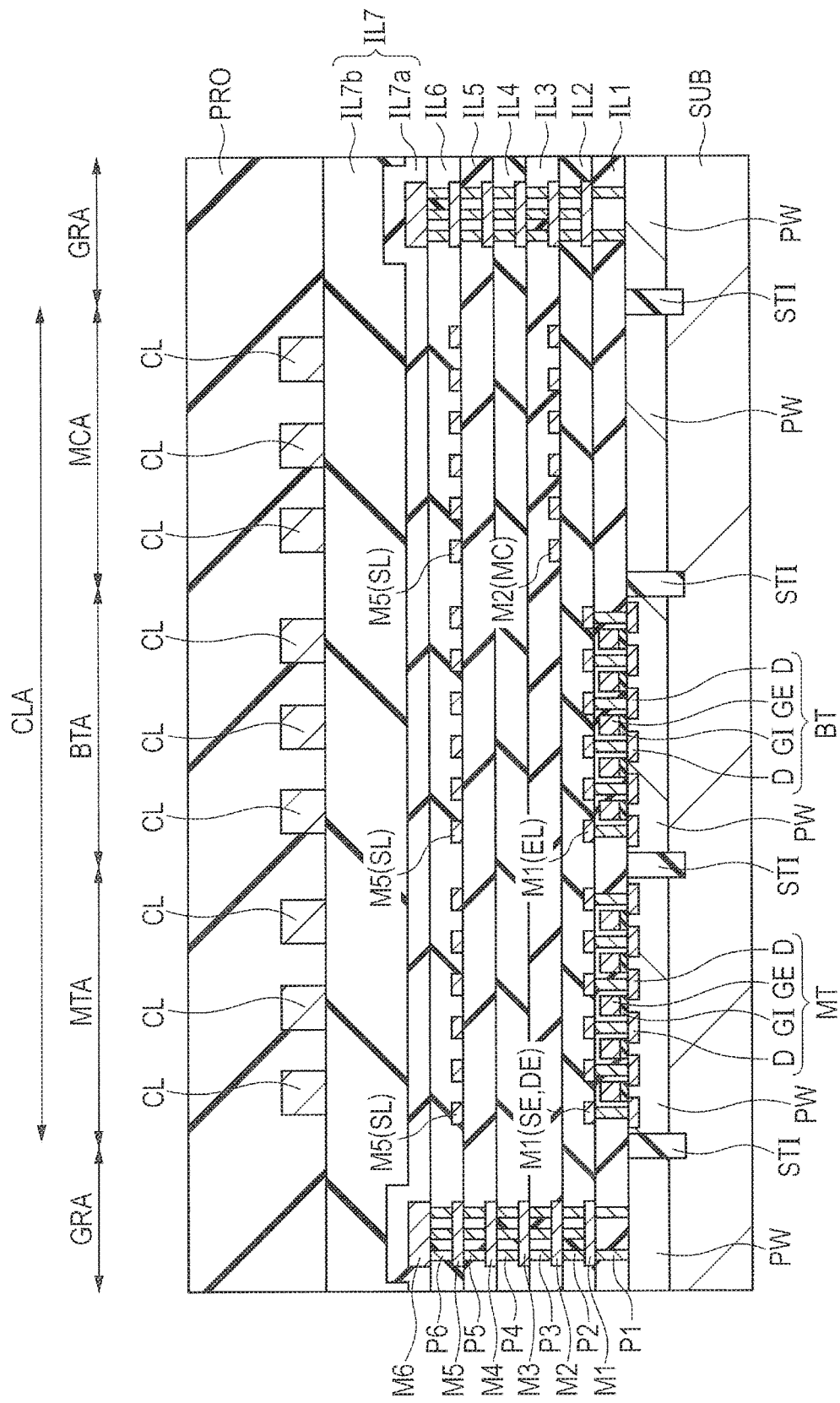
FIG. 31 is a cross-sectional view for showing a manufacturing step of the semiconductor device of the third embodiment.

In the embodiment, a shield layer SL is incorporated into the configuration of the second embodiment.
[Description of Structure]
FIG. 31 is a cross-sectional view for schematically showing a configuration of a semiconductor device of the embodiment.

As shown in FIG. 31, while MOM capacitance elements (MC and M2), a MOS varactor BT, and a MOS transistor MT are arranged under a coil (spiral inductor) CL in the embodiment (PLL circuit), shield layers SL are provided between these elements and the coil (spiral inductor) CL.

The embodiment is the same as the second embodiment (FIG. 24) except the configuration of the shield layers SL, and thus the configuration of the shield layers SL will be described in detail.

As shown in FIG. 31, the shield layers SL are provided in the fifth wiring layer (M5 layer) in the embodiment. The shield layers SL can be a plurality of linear wiring parts (FIG. 19B) extending in the Y direction. Here, the linear wiring parts are provided using the wiring M5 layer (M5 layer).

As described above, it is possible to reduce the area of the semiconductor device while keeping the characteristics (for example, RF characteristics) of the semiconductor device even in the embodiment. In addition, an effect of suppressing noise from the elements under the coil (spiral inductor) CL becomes high by providing the shield layers SL in the embodiment.
[Description of Manufacturing Method]

The semiconductor device of the embodiment can be formed using the same steps as those of the second embodiment. Namely, a plurality of linear wiring parts (FIG. 19B) extending in the Y direction may be formed in each region (MTA, BTA, and MCA) in the step of forming the wirings M5.
(First Application)

Figure 32:
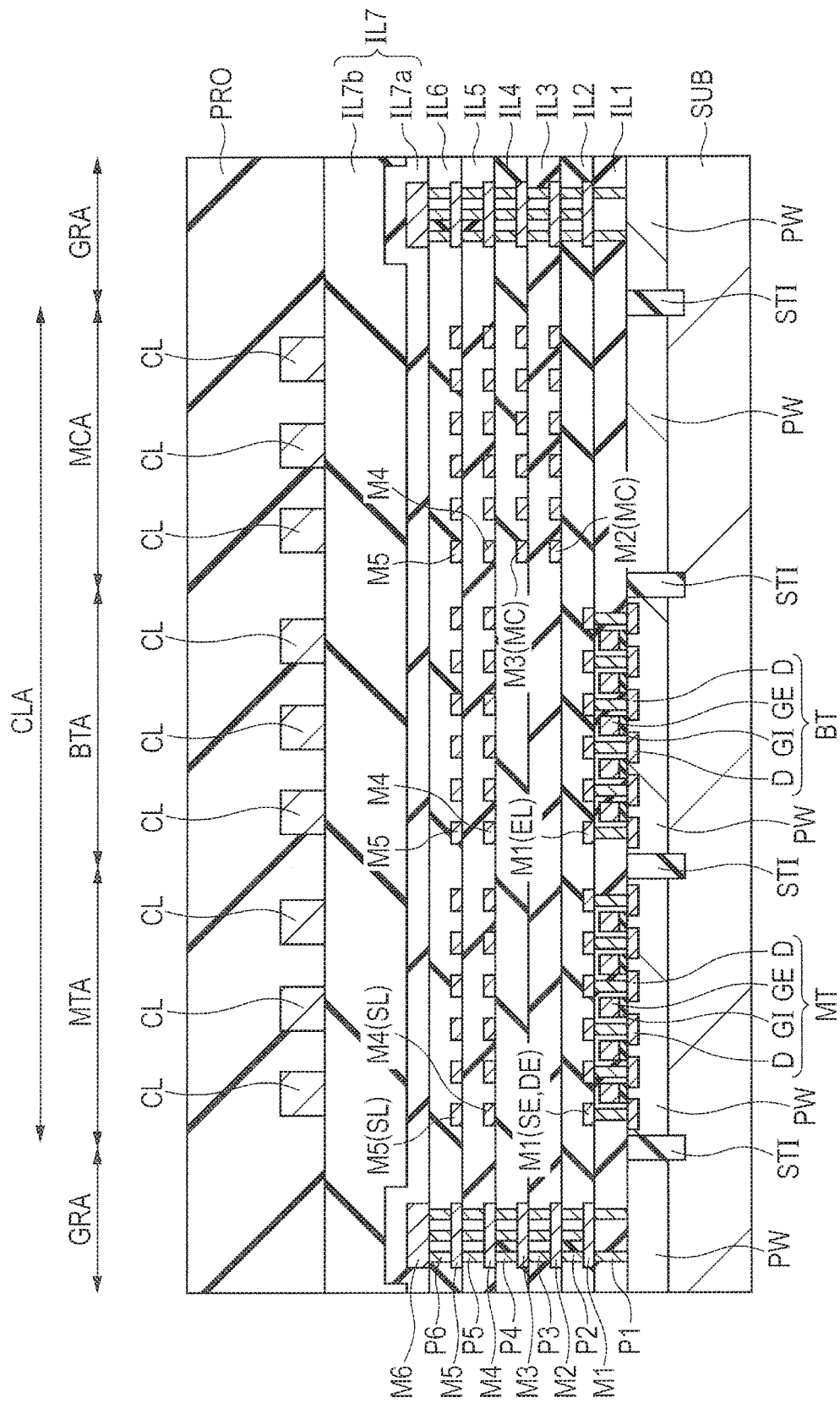
FIG. 32 is a cross-sectional view for showing a manufacturing step of the semiconductor device of the third embodiment.

In the semiconductor device shown in FIG. 31, the shield layers SL are arranged only in the fifth wiring layer (M5 layer). However, as shown in FIG. 32, the shield layers SL may be arranged in the fourth wiring layer (M4 layer) and the fifth wiring layer (M5 layer). In addition, the MOM capacitance element (MC) may be arranged in the second wiring layer (M2 layer) and the third wiring layer (M3 layer). FIG. 32 is a cross-sectional view for schematically showing another configuration of the semiconductor device of the embodiment.
(Second Application)

Figure 33A:
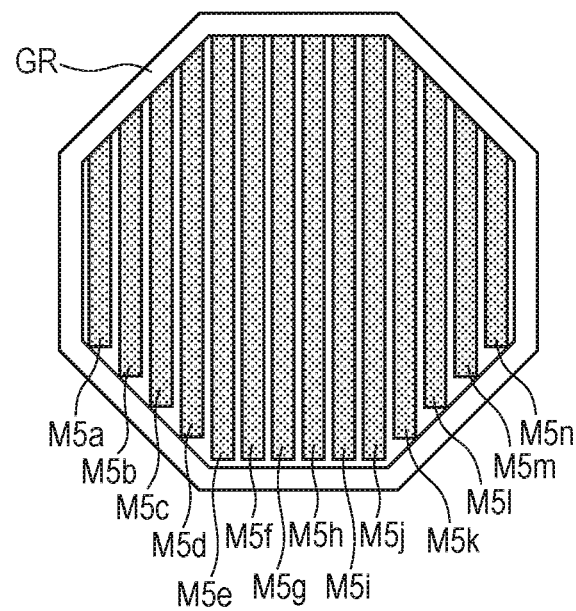
FIGS. 33A to 33B are plan views each showing a layout of wiring parts of a shield layer.
Figure 33B:
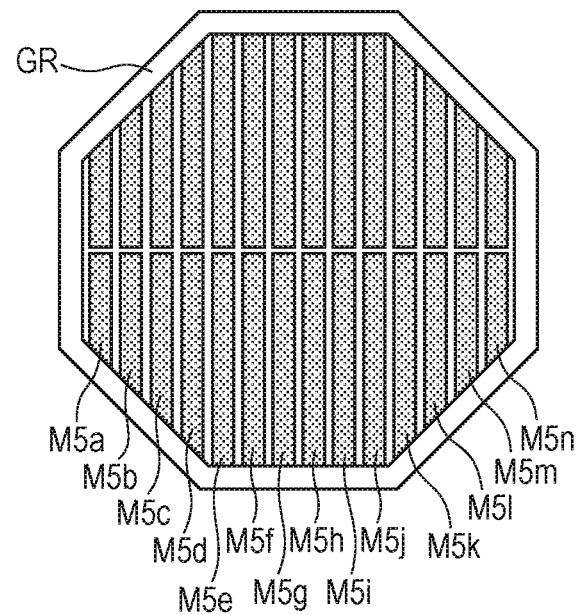

The wiring parts configuring the shield layers SL may be laid out as shown in FIG. 7B and FIG. 7C in addition to FIG. 19B. In addition, the shield layers SL may be laid out as shown in FIG. 33A and FIG. 33B. FIGS. 33A and 33B are plan views each showing a layout of the wiring parts (M5a to M5n) of the shield layers.

Fourth Embodiment

In the embodiment, a relation between a coil (spiral inductor) CL and a re-wiring RW will be described.
[Description of Structure]

Figure 34:
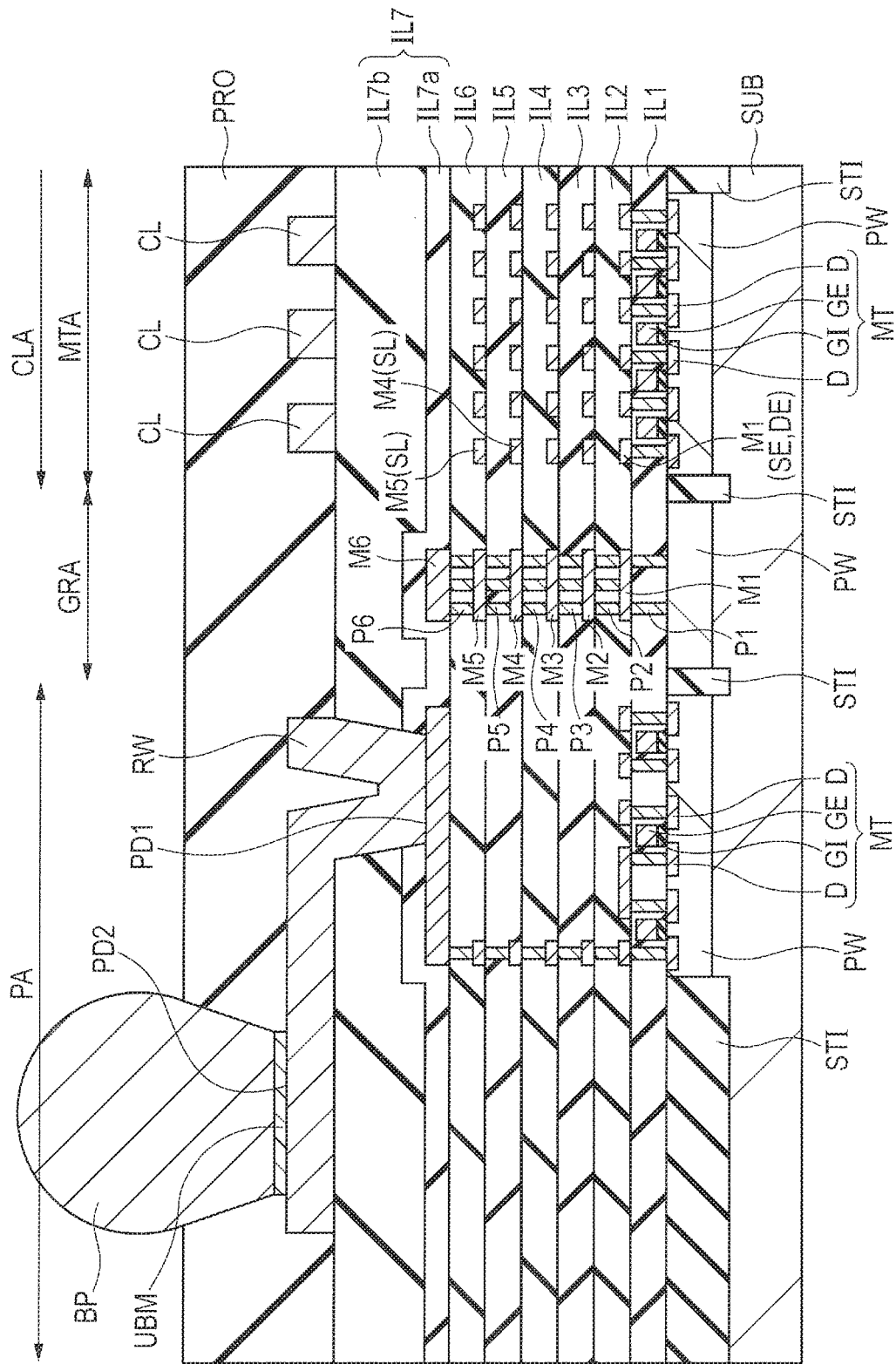
FIG. 34 is a cross-sectional view for schematically showing a configuration of a semiconductor device of a fourth embodiment.
Figure 35:
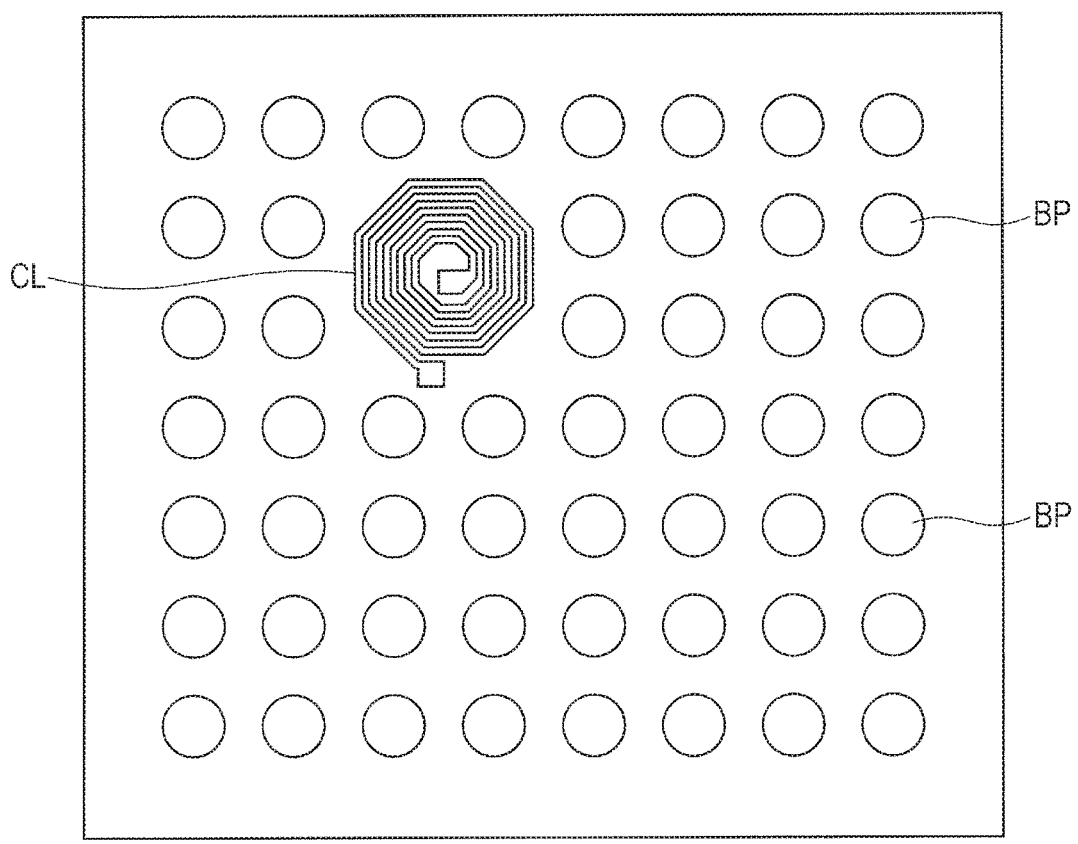
FIG. 35 is a plan view for showing a configuration of the semiconductor device of the fourth embodiment.

FIG. 34 is a cross-sectional view for schematically showing a configuration of a semiconductor device of the embodiment, and FIG. 35 is a plan view for showing a configuration of the semiconductor device of the embodiment.

As described above, the element such as the MOS transistor MT can be arranged under the coil (spiral inductor) CL.

As shown in FIG. 35, bump electrodes BP are arranged in a chip region in an array pattern. However, the bump electrodes BP are not provided on a formation region for the coil (spiral inductor) CL.
[Description of Manufacturing Method]

Figure 36:
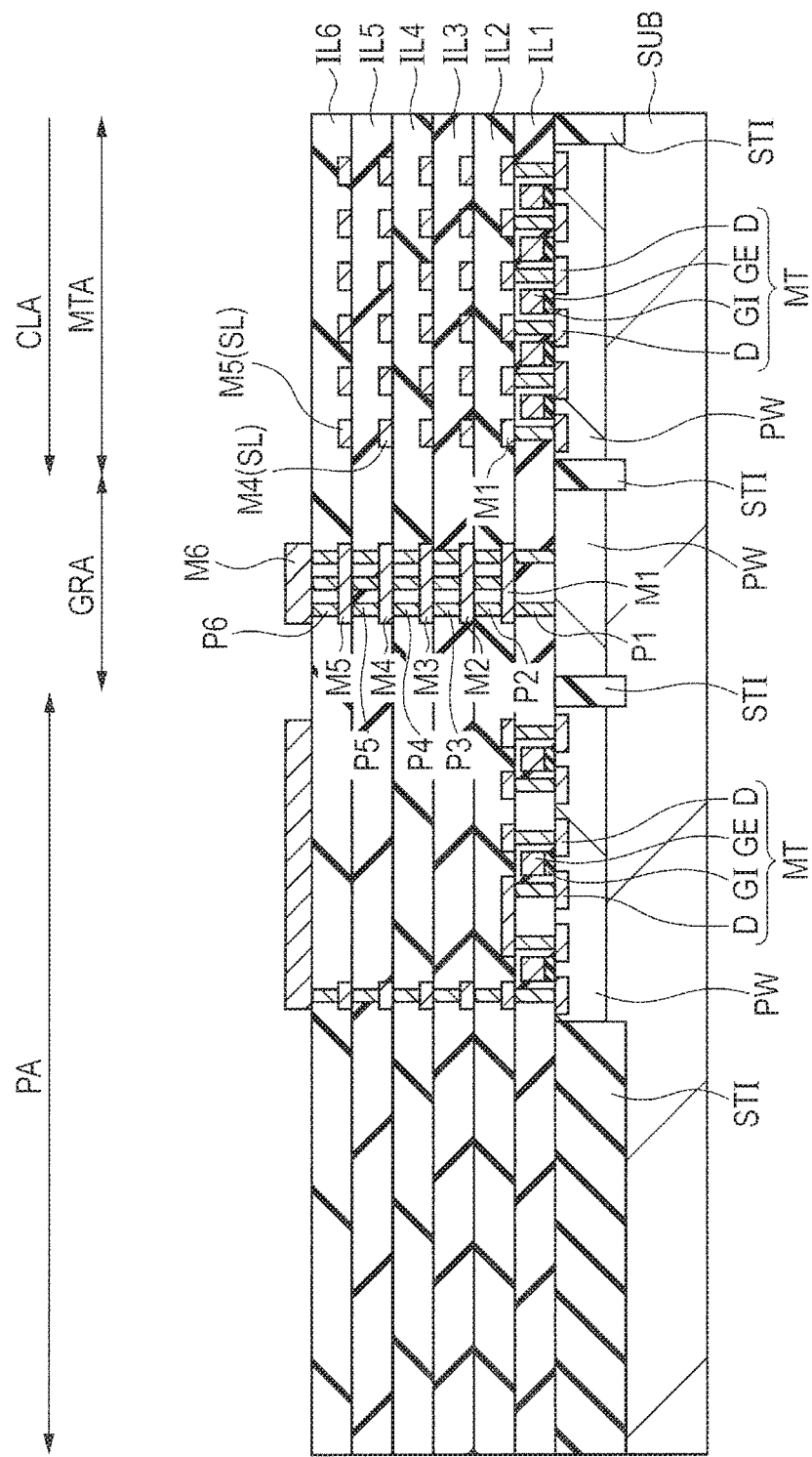
FIG. 36 is a cross-sectional view for showing a manufacturing step of the semiconductor device of the fourth embodiment.
Figure 37:
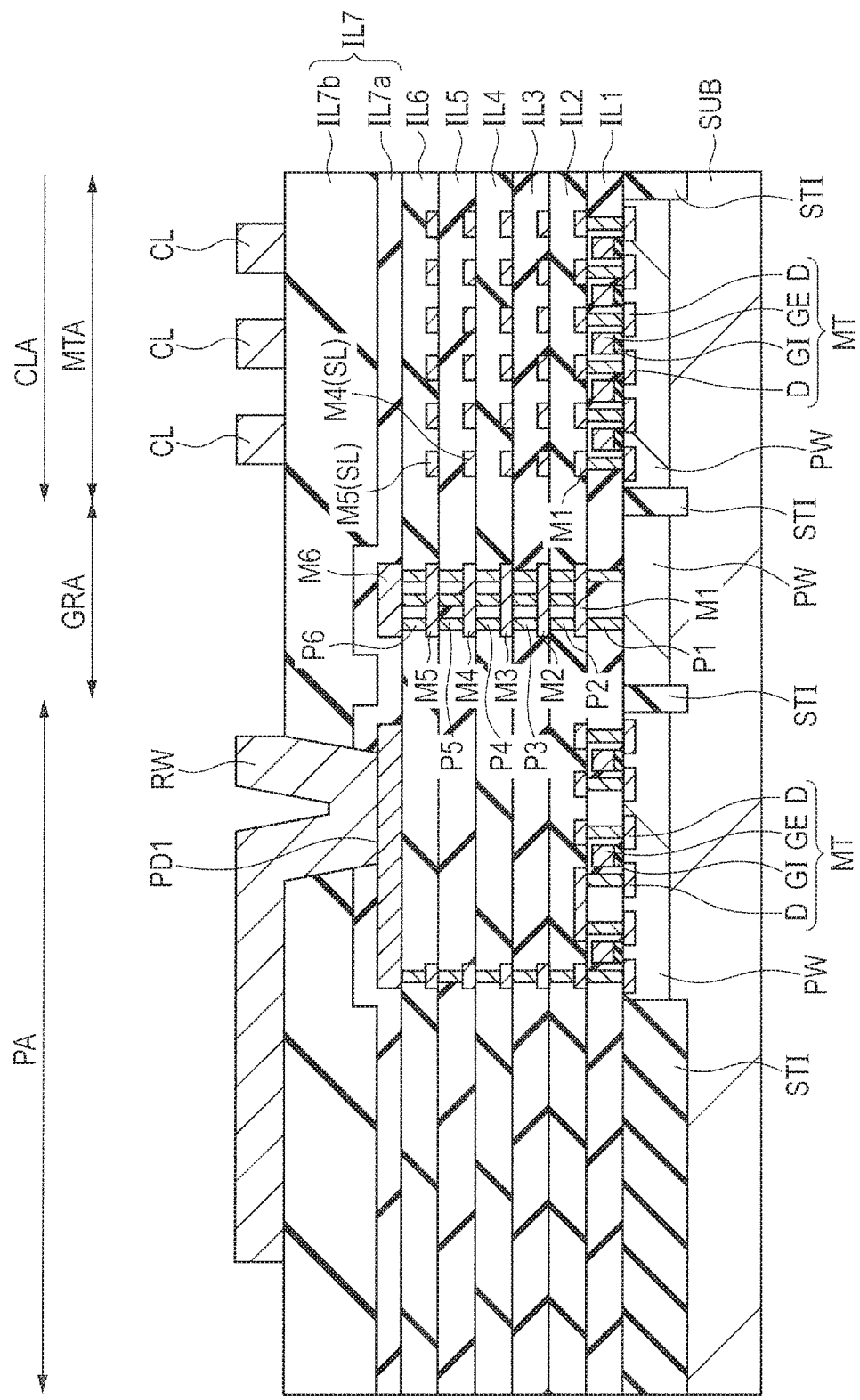
FIG. 37 is a cross-sectional view for showing a manufacturing step of the semiconductor device of the fourth embodiment.
Figure 38:
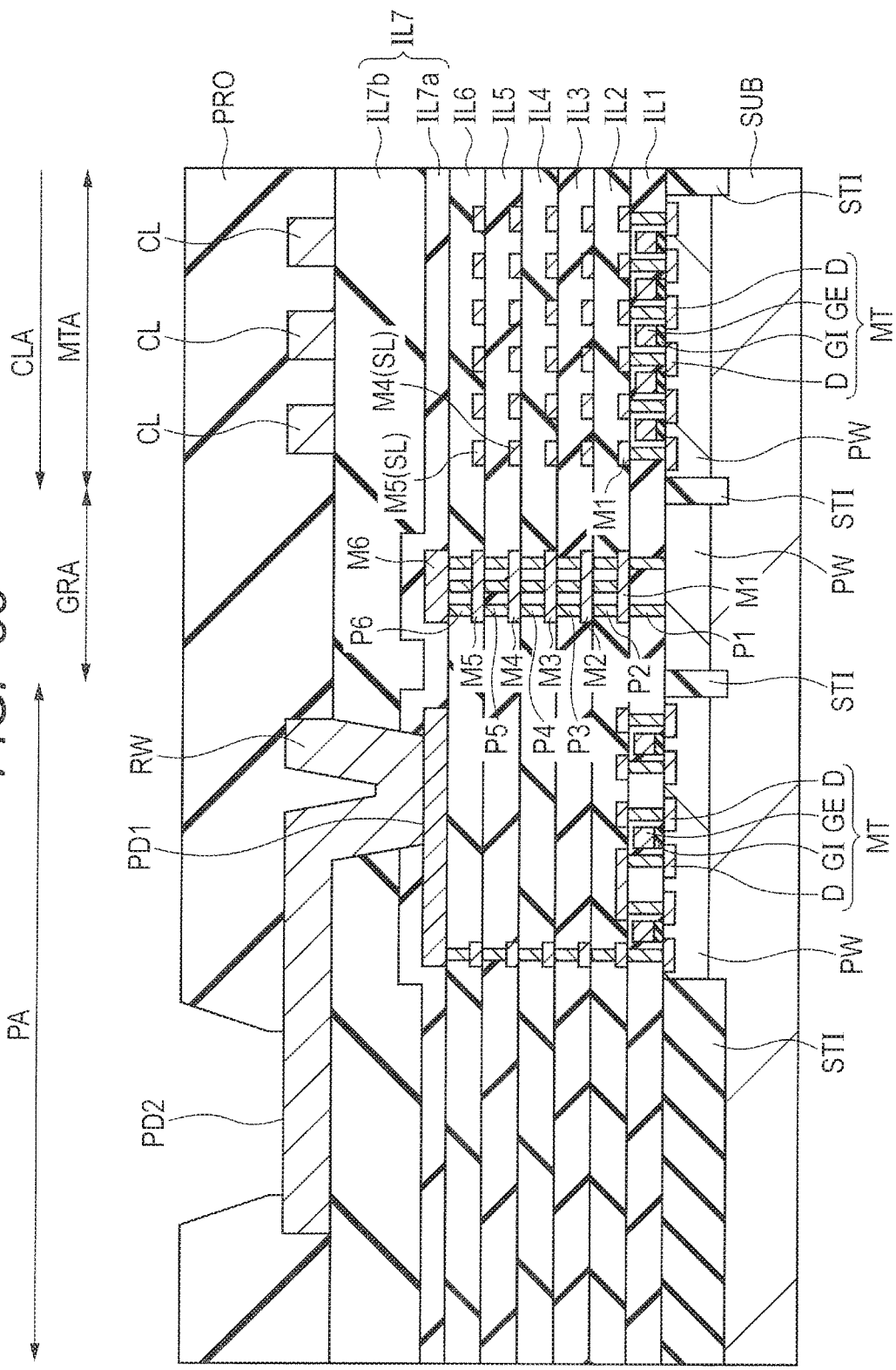
FIG. 38 is a cross-sectional view for showing a manufacturing step of the semiconductor device of the fourth embodiment.

Next, a manufacturing method of the semiconductor device of the embodiment will be described with reference to FIG. 36 to FIG. 38, and the configuration of the semiconductor device will be further clarified. FIG. 36 to FIG. 38 are cross-sectional views for showing manufacturing steps of the semiconductor device of the embodiment.

As similar to the second embodiment, after the MOS transistor MT is formed on the semiconductor substrate SUB, the multilayer wirings (M1 to M6) are formed (FIG. 36).

Next, as shown in FIG. 37, an insulation film IL7a is formed on the wirings M6 and an interlayer insulation film IL6. For example, a nitride silicon film is deposited by the CVD method and the like. Next, the insulation film IL7a is coated with, for example, a photosensitive polyimide film as an insulation film IL7b. Next, a pad region PD1 is formed. Namely, a photosensitive polyimide film is exposed and developed to remove a polyimide film in the pad region PD1, and an opening part (an opening region or an exposed part of the sixth wirings M6) is formed. A heat process is performed thereafter to cure the polyimide film. Thereby, an interlayer insulation film IL7 having the opening part in the pad region PD1 and configured using a lamination film of the insulation film IL7a and the insulation film IL7b is formed.

Next, as shown in FIG. 38, the re-wiring RW and the coil (inductor) CL are formed on the insulation film IL7b including the pad region PD1. The re-wiring RW and the coil (inductor) CL are formed by growing a Cu film (copper film) by, for example, the electrolytic plating method to have a thickness of about 5 to 8 μm. As described above, the coil CL is formed using the re-wiring layer. By forming the coil CL using the re-wiring layer, a distance to the wirings of the lower layer can be secured, and the film thickness can be increased. As described above, the characteristics of the device can be improved by configuring the coil CL using the re-wiring layer.

Next, for example, a photosensitive polyimide film as an insulation film (protection film) PRO is formed on the re-wiring RW, the coil (inductor) CL, and the interlayer insulation film IL7. Next, a photosensitive polyimide film is exposed and developed to remove a polyimide film in a pad region PD2, and an opening part (an opening region or an exposed part of the re-wiring RW) is formed. Thereafter, a base metal film UBM is formed on the pad region PD2, and further the bump electrode BP is formed thereon (FIG. 34).

Figure 39:
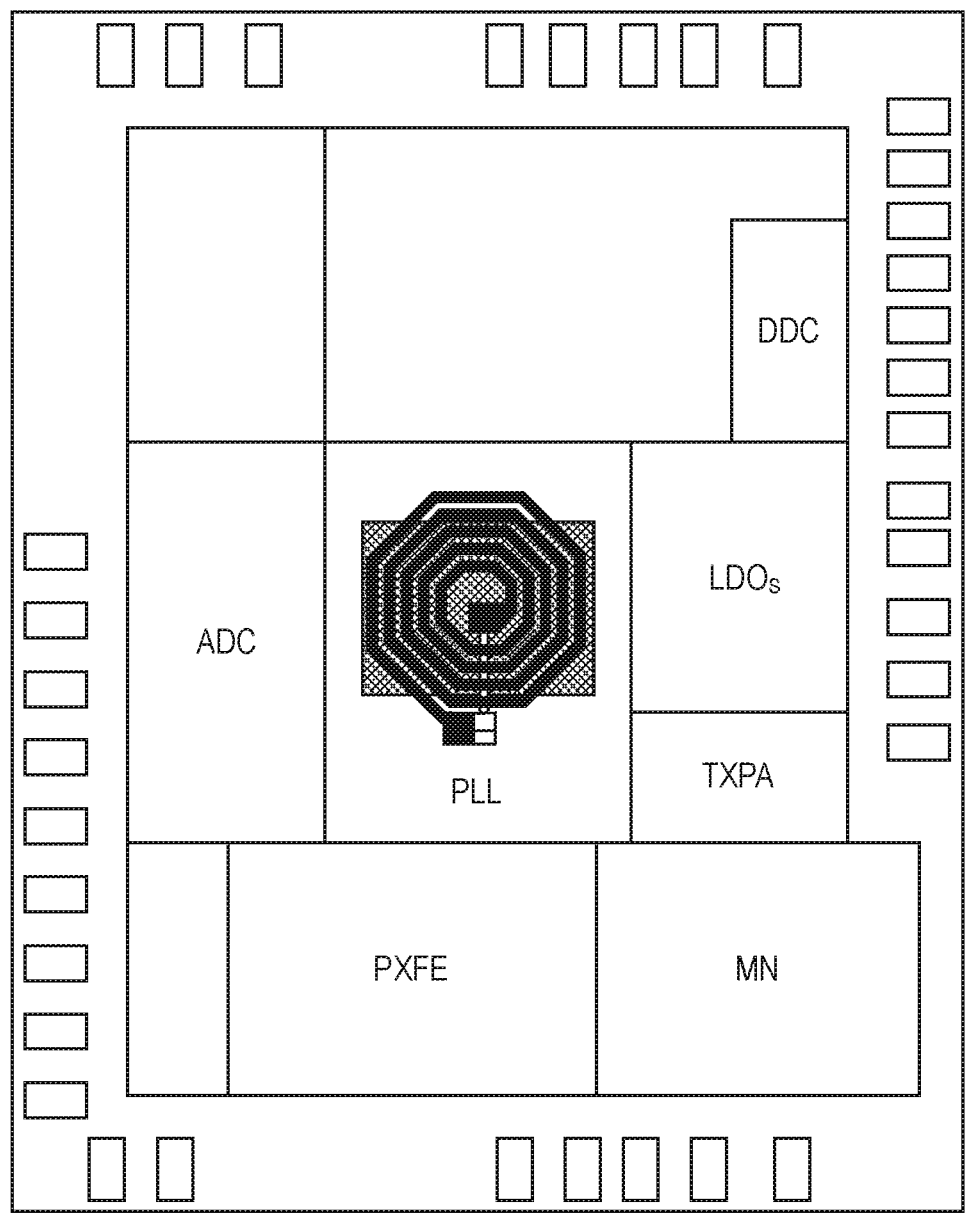
FIG. 39 is a plan view for showing a configuration of a semiconductor chip into which a PLL circuit is incorporated.

FIG. 39 is a plan view for showing a configuration of a semiconductor chip into which a PLL circuit is incorporated. As shown in FIG. 39, the semiconductor chip has rectangular external terminals at the outer periphery, and a plurality of circuit blocks (ADC, DDC, LDOS, TXPA, PXFE, MN, and the like) in addition to the PLL circuit described in the second embodiment is incorporated therein.

The invention achieved by the inventors has been concretely described above on the basis of the embodiments. However, it is obvious that the present invention is not limited to the above-described embodiments, and can be variously changed without departing from the scope thereof.

What is claimed is:
1. A semiconductor device comprising:
a semiconductor substrate;
a guard ring formed over the semiconductor substrate;
a plurality of first linear wiring parts formed in an inner side of the guard ring in plan view such that one end of each of the plurality of first linear wiring parts is coupled to the guard ring; and
a coil formed over the plurality of linear wiring parts such that an outermost periphery of the coil is apart from the guard ring in plan view,
wherein, in plan view, each of the plurality of first linear wiring parts extends in a first direction such that both ends of each of the plurality of first linear wiring parts are not closed,
wherein, in plan view, the coil overlaps with the plurality of first linear wiring parts, and
wherein the plurality of first linear wiring parts is electrically coupled to each other through the guard ring.
2. The semiconductor device according to claim 1,
wherein the guard ring comprises:
a plurality of first wirings formed in a same layer as the plurality of first linear wiring parts;
a plurality of plugs formed on the plurality of first wirings; and
a plurality of second wirings coupled to the plurality of first wirings through the plurality of plugs.

3. The semiconductor device according to claim 2,
wherein, in plan view, the guard ring is formed in an octagon shape and has:
a first side;
a second side intersecting with the first side;
a third side intersecting with the first side;
a fourth side intersecting with the second side;
a fifth side intersecting with the third side and being opposite to the fourth side;
a sixth side intersecting with the fourth side and being opposite to the third side;
a seventh side intersecting with the fifth side and being opposite to the second side; and
an eighth side intersecting with the sixth and the seventh sides and being opposite to the first side, and
wherein the plurality of first linear wiring parts is coupled to the first, second and third sides.
4. The semiconductor device according to claim 3, comprising a plurality of second linear wiring parts formed in the inner side of the guard ring in plan view such that the plurality of second linear wiring parts is coupled to the sixth, seventh and eighth sides,
wherein, in plan view, each of the plurality of second linear wiring parts extends in the first direction such that both ends of each of the plurality of second linear wiring parts are not closed,
wherein, in plan view, the coil overlaps with the plurality of second linear wiring parts, and
wherein the plurality of second linear wiring parts is electrically coupled to each other through the guard ring.
5. The semiconductor device according to claim 4, comprising:
a plurality of third linear wiring parts formed in the inner side of the guard ring in plan view such that the plurality of third linear wiring parts is coupled to the second, fourth and sixth sides; and
a plurality of fourth linear wiring parts formed in the inner side of the guard ring in plan view such that the plurality of fourth linear wiring parts is coupled to the third, fifth and seventh sides,
wherein, in plan view, each of the plurality of third linear wiring parts extends in a second direction perpendicular to the first direction such that both ends of each of the plurality of third linear wiring parts are not closed,
wherein, in plan view, each of the plurality of fourth linear wiring parts extends in the second direction such that both ends of each of the plurality of fourth linear wiring parts are not closed,
wherein, in plan view, the coil overlaps with the plurality of third linear wiring parts and the plurality of fourth linear wiring parts,
wherein the plurality of third linear wiring parts is electrically coupled to each other through the guard ring, and
wherein the plurality of fourth linear wiring parts is electrically coupled to each other through the guard ring.
6. The semiconductor device according to claim 5,
wherein, in plan view, the coil is configured using a spiral wiring, and
wherein the coil is formed in an octagon shape.
7. The semiconductor device according to claim 5,
wherein, in plan view, a transistor formation region overlaps with the coil, the plurality of first linear wiring parts, the plurality of second linear wiring parts, the plurality of third linear wiring parts and the plurality of fourth linear wiring parts.

8. The semiconductor device according to claim 7, comprising:
    a multilayer wiring formed on the semiconductor substrate and including the guard ring, the plurality of first linear wiring parts, the plurality of second linear wiring parts, the plurality of third linear wiring parts and the plurality of fourth linear wiring parts; and
    a protection film formed on the multilayer wiring,
    wherein the coil is formed on the protection film.

9. The semiconductor device according to claim 8,
    wherein the plurality of first linear wiring parts, the plurality of second linear wiring parts, the plurality of third linear wiring parts and the plurality of fourth linear wiring parts are formed by aluminum film, and
    wherein the coil is formed by copper film.

10. The semiconductor device according to claim 9,
    wherein the protection film is formed by polyimide film.

11. The semiconductor device according to claim 7, comprising a multilayer wiring formed on the semiconductor substrate and including the coil, the guard ring, the plurality of first linear wiring parts, the plurality of second linear wiring parts, the plurality of third linear wiring parts and the plurality of fourth linear wiring parts.

12. The semiconductor device according to claim 11,
    wherein the coil, the plurality of first linear wiring parts, the plurality of second linear wiring parts, the plurality of third linear wiring parts and the plurality of fourth linear wiring parts are formed by aluminum film.

13. The semiconductor device according to claim 7,
    wherein each of the plurality of first linear wiring parts has a wiring width of 1 μm or smaller,
    wherein each of the plurality of second linear wiring parts has a wiring width of 1 μm or smaller,
    wherein each of the plurality of third linear wiring parts has a wiring width of 1 μm or smaller, and
    wherein each of the plurality of fourth linear wiring parts has a wiring width of 1 μm or smaller.

14. The semiconductor device according to claim 7,
    wherein, in a third direction perpendicular to the first and second directions, a distance between an upper surface of each of the plurality of first wirings and a bottom surface of the coil is 7 μm or more.

15. The semiconductor device according to claim 14,
    wherein, in a third direction perpendicular to the first and second directions, a distance between an upper surface of the plurality of first wirings and a bottom surface of the coil is 7 μm or more.

16. The semiconductor device according to claim 7,
    wherein, in plan view, a distance between the outermost periphery of the coil and the guard ring is 30 μm or more.

* * * * *